US010991509B2

(12) United States Patent
Nakagawa et al.

(10) Patent No.: US 10,991,509 B2
(45) Date of Patent: Apr. 27, 2021

(54) CAPACITOR

(71) Applicant: Murata Manufacturing Co., Ltd., Nagaokakyo (JP)

(72) Inventors: Hiroshi Nakagawa, Nagaokakyo (JP); Tomoyuki Ashimine, Nagaokakyo (JP); Yasuhiro Murase, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 0 days.

(21) Appl. No.: 16/668,513

(22) Filed: Oct. 30, 2019

(65) Prior Publication Data

US 2020/0066445 A1 Feb. 27, 2020

Related U.S. Application Data

(63) Continuation of application No. PCT/JP2018/026120, filed on Jul. 11, 2018.

(30) Foreign Application Priority Data

Jul. 25, 2017 (JP) .............................. JP2017-143871

(51) Int. Cl.
*H01G 4/33* (2006.01)
*H01G 4/12* (2006.01)
(Continued)

(52) U.S. Cl.
CPC ........... *H01G 4/1209* (2013.01); *H01G 4/008* (2013.01); *H01G 4/012* (2013.01); *H01G 4/085* (2013.01); *H01G 4/306* (2013.01); *H01G 4/33* (2013.01)

(58) Field of Classification Search
None
See application file for complete search history.

(56) References Cited

U.S. PATENT DOCUMENTS 6,788,521 B2 9/2004 Nishi
7,161,793 B2 1/2007 Kurihara et al.
(Continued)

FOREIGN PATENT DOCUMENTS

JP S62206870 A 9/1987
JP 2003110023 A 4/2003
(Continued)

OTHER PUBLICATIONS

International Search Report issued in PCT/JP2018/026120, dated Sep. 18, 2018.
(Continued)

*Primary Examiner* — Dion Ferguson
(74) *Attorney, Agent, or Firm* — Arent Fox LLP

(57) ABSTRACT

A capacitor is provided that includes a base having a first main surface and a second main surface opposing each other with a trench formed on a side of the first main surface (110A. Moreover, a dielectric film is disposed in a region that includes an inside of the trench on the side of the first main surface of the base; a conductor film is provided that includes a first conductor layer disposed on the dielectric film, which is the region including the inside of the trench and a second conductor layer disposed on the first conductor layer; and a stress relieving portion is provided in contact with at least a part of the end of the first conductor layer. Moreover, a thickness of the stress relieving portion is smaller than a thickness of the conductor film, outside the trench portion of the first main surface of the base.

17 Claims, 16 Drawing Sheets

(51) Int. Cl.
*H01G 4/008* (2006.01)
*H01G 4/012* (2006.01)
*H01G 4/08* (2006.01)
*H01G 4/30* (2006.01)

(56) References Cited

U.S. PATENT DOCUMENTS

| | | |
|---|---|---|
| 9,455,151 B2 | 9/2016 | Bauer et al. |
| 2003/0063428 A1 | 4/2003 | Nishi |
| 2004/0130849 A1 | 7/2004 | Kurihara et al. |
| 2006/0157766 A1* | 7/2006 | Won .................. H01L 28/60 257/296 |
| 2009/0108344 A1* | 4/2009 | Kumekawa ......... H01L 29/4238 257/330 |
| 2009/0108403 A1* | 4/2009 | Gogoi .................. H01L 28/91 257/532 |
| 2015/0145104 A1 | 5/2015 | Bauer et al. |
| 2015/0305159 A1* | 10/2015 | Yamamoto .............. H01G 4/40 361/767 |
| 2019/0244761 A1* | 8/2019 | Kagawa ................ H01G 4/012 |

FOREIGN PATENT DOCUMENTS

| | | |
|---|---|---|
| JP | 2004214589 A | 7/2004 |
| JP | 2005353657 A | 12/2005 |
| JP | 5981519 B2 | 8/2016 |

OTHER PUBLICATIONS

Written Opinion of the International Searching Authority issued in PCT/JP2018/026120, dated Sep. 18, 2018.

* cited by examiner

CAPACITOR

CROSS REFERENCE TO RELATED APPLICATIONS

The present application is a continuation of PCT/JP2018/026120 filed Jul. 11, 2018, which claims priority to Japanese Patent Application No. 2017-143871, filed Jul. 25, 2017, the entire contents of each of which are incorporated herein by reference.

TECHNICAL FIELD

The present invention relates generally to a capacitor.

BACKGROUND

With increased functions of electronic devices to be mounted, capacitors need to have an improved performance such as an improved capacitance density or an improved withstand voltage. For example, a current capacitor exists in which a capacitor structure has a trench portion that is formed to improve the capacitance density of the capacitor. In order to stably operate the capacitor at a high operating voltage, a configuration is disclosed in which a dielectric film of the capacitor is thickened. However, when the dielectric film is thickened, the internal stress of the dielectric film, which increases in accordance with the film thickness, may damage the dielectric film, thereby deteriorating the reliability of the capacitor. Particularly, when such capacitors have a trench portion, damage to the dielectric film is likely to occur due to a decrease in the rigidity of the substrate due to the provision of the trench portion, stress concentration on the corners of the trench portion, and the like.

In order to suppress the damage to the dielectric film due to internal stress, Patent Document 1 (identified below) discloses a capacitor in which the deformation of the substrate is reduced by a configuration in which the capacitor has a capacitor structure both in a first main surface region and a second main surface region, or a configuration in which the capacitor has the capacitor structure in the first main surface region and a compensation structure in the second main surface region.

Patent Document 1: U.S. Pat. No. 5,981,519.

Incidentally, the internal stress of an upper electrode is concentrated on the end portion of the upper electrode. If the internal stress concentrated on the end portion is transmitted to the dielectric film, the dielectric film can be damaged. However, in the capacitor described in Patent Document 1, the deformation of the substrate is suppressed, but the internal stress itself applied to the first main surface is not reduced. Particularly, the internal stress concentrated on the end portion of the upper electrode is not relieved, and thus there is a possibility that the damage to the dielectric film cannot be sufficiently suppressed.

SUMMARY OF THE INVENTION

The present invention has been made in view of such circumstances. Accordingly, it is an object of the present invention is to provide a capacitor whose reliability can be improved.

Thus, a capacitor according to one exemplary aspect of the present invention is provided that includes a base having a first main surface and a second main surface opposed to each other and a trench portion formed on a side of the first main surface. Moreover, a dielectric film is provided in a region including an inside of the trench portion on the side of the first main surface of the base; a conductor film including a first conductor layer provided on the dielectric film, which is the region including the inside of the trench portion, and a second conductor layer provided on the first conductor layer; and a stress relieving portion provided in contact with at least a part of the end portion of the first conductor layer. Furthermore, a thickness of the stress relieving layer is smaller than a thickness of the conductor film, outside the trench portion of the first main surface of the base member.

A capacitor according to another exemplary aspect of the present invention is provided that includes a base having a first main surface and a second main surface opposed to each other and a trench portion formed on a side of the first main surface. In addition, a dielectric film is provided in a region including an inside of the trench portion on the side of the first main surface of the base; a conductor film including a first conductor layer provided on the dielectric film, which is the region including the inside of the trench portion, and a second conductor layer provided on the first conductor layer; and a stress relieving portion provided in contact with at least a part of the end portion of the first conductor layer. Moreover, a direction of a residual stress of the stress relieving portion is opposite to a direction of a residual stress of the second conductor layer.

According to the exemplary embodiments of the present invention, a capacitor is provided with improved reliability.

DETAILED DESCRIPTION

Figure 1:
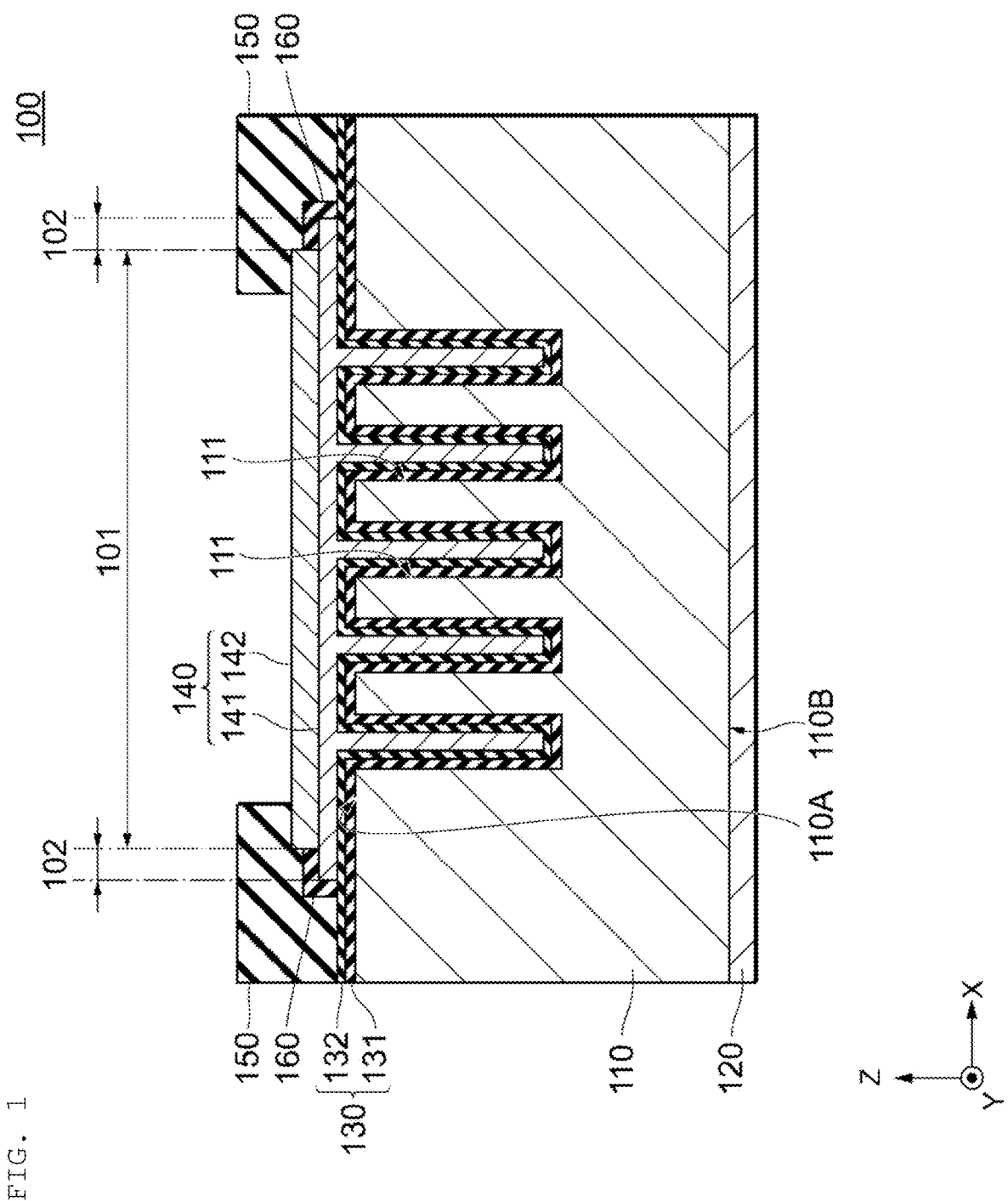
FIG. 1 is a cross-sectional view schematically illustrating a configuration of a capacitor according to a first exemplary embodiment.

Hereinafter, exemplary embodiments of the present invention will be described with reference to the drawings. In the second and subsequent exemplary embodiments, the same or similar constituent elements as or to those in the first embodiment are designated by the same or similar reference numerals as or to those in the first embodiment, and the detailed description will be appropriately omitted. With respect to effects obtained in the second and subsequent embodiments, descriptions of the same effects as those in the first embodiment will be appropriately omitted. The drawings of the respective embodiments are exemplifications, the dimensions and shapes of the respective parts are schematic, and the technical scope of the present invention should not be interpreted as being limited to the embodiments.

First Exemplary Embodiment

Figure 2:
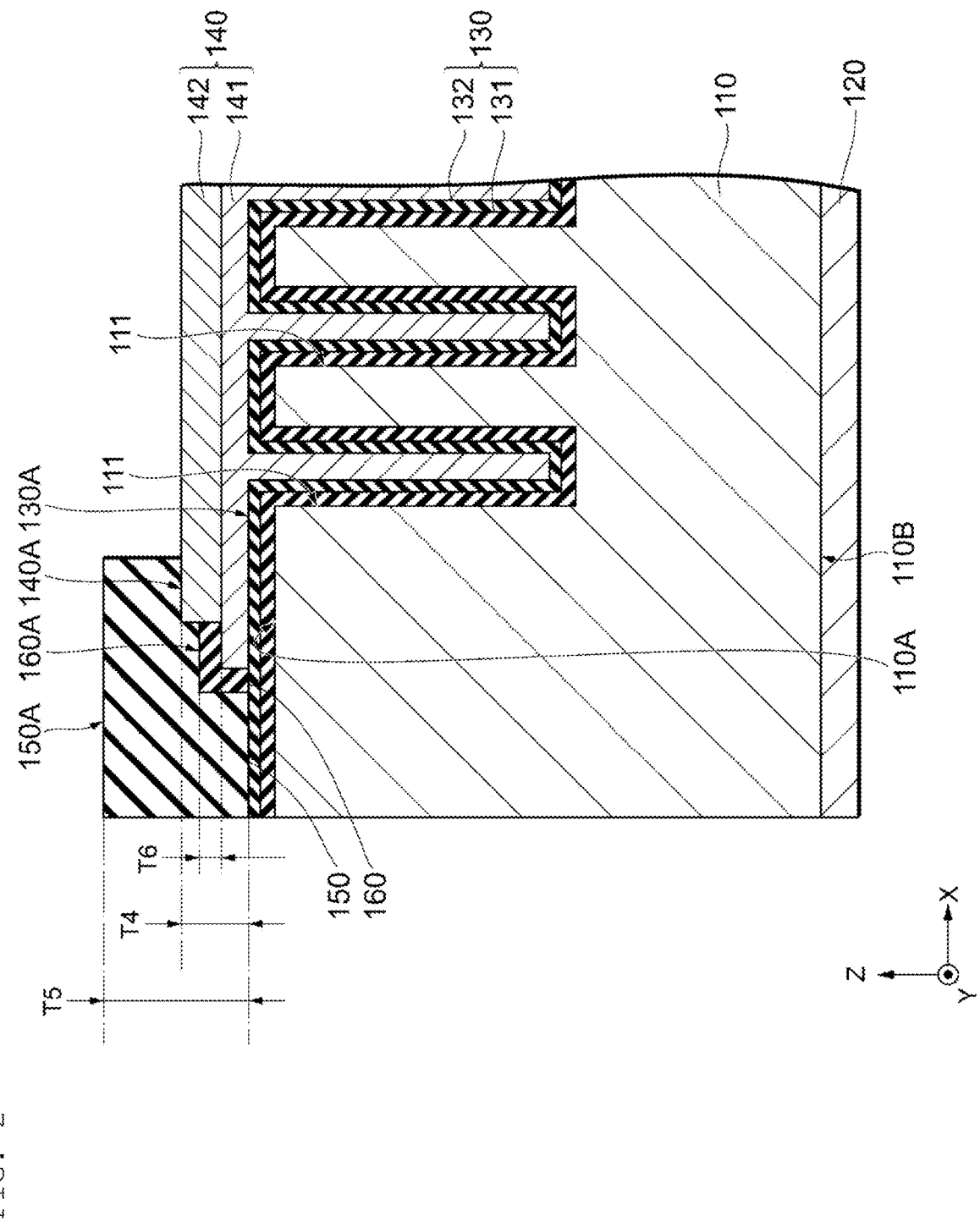
FIG. 2 is an enlarged cross-sectional view centering on a stress relieving layer of the capacitor illustrated in FIG. 1.

First, a configuration of a capacitor 100 according to the first exemplary embodiment of the present invention will be described with reference to FIGS. 1 and 2. FIG. 1 is a cross-sectional view schematically illustrating the configuration of the capacitor according to the first embodiment. FIG. 2 is an enlarged cross-sectional view centering on a stress relieving layer of the capacitor illustrated in FIG. 1.

It is noted that although the first direction X, the second direction Y, and the third direction Z illustrated in the drawings are directions perpendicular to each other, the exemplary embodiments of the present invention is not limited thereto as long as the directions cross each other. The directions may cross each other at an angle other than 90°. Further, the first direction X, the second direction Y, and the third direction Z mean different directions crossing each other, and each of the directions is not limited to the positive directions of the arrows illustrated in FIG. 1 and also includes the negative directions opposite to the directions of the arrows.

As shown, the capacitor 100 has a first region 101 and a second region 102. The first region 101 is a region that overlaps with a second conductor layer 142 when viewed in a planar view from the normal direction of a first main surface 110A of a base or base member 110 (the terms base and base member are used interchangeably herein). Further, the second region 102 is a region that overlaps with an end portion of a first conductor layer 141 extending outward beyond the second conductor layer 142 when viewed in a planar view from the normal direction of the first main surface 110A of the base member 110.

The capacitor 100 includes the base member 110, the first conductor film 120, a dielectric film 130, a second conductor film 140, a protective film 150, and a stress relieving structure or layer 160 (the terms stress relieving structure, stress relieving layer and stress relieving portion are used interchangeably herein). For example, the stress relieving layer 160 is one aspect of a stress relieving portion. Moreover, the first conductor film 120 corresponds to a lower electrode of the capacitor 100, and the second conductor film 140 corresponds to an upper electrode of the capacitor 100.

In an exemplary aspect, the base member 110 is, for example, a single layer structure made of a low-resistance silicon substrate having conductivity. The base member 110 has the first main surface 110A on the positive direction side in the third direction Z, and has the second main surface 110B on the negative direction side in the third direction Z. The first main surface 110A is, for example, a crystal plane whose crystal orientation is represented as <100>. The first main surface 110A and the second main surface 110B are surfaces parallel to the surface specified by the first direction X and the second direction Y (hereinafter referred to as "XY surface"). The base member 110 may be an insulating substrate such as quartz. In one aspect, the base member 110 may have a multilayer structure, and may be, for example, a laminated body of a conductive substrate and an insulator film.

A plurality of trench portions 111 are disposed and/or formed on the side of the first main surface 110A of the base member 110. Each of the trench portions 111 is a bottomed recess portion having a cavity on the side of the first main surface 110A and extending into the base member 110. The trench portions 111 are formed in the first region 101. As an example, each of the trench portions 111 has a cylindrical shape with a depth of 10 μm to 50 μm and a bottom diameter of about 5 μm. The trench portions are provided in the region for forming the capacitance, so that it is possible to increase the area of opposed electrodes without increasing the size of the capacitor 100 and to improve the capacitance value of the capacitor 100. The shape and size of each of the trench portions 111 are not limited to the above-described shape and size. The shape of each of the trench portions 111 may be, for example, an elliptic cylindrical shape, a polygonal cylindrical shape, a groove shape or a combination thereof. Further, in the illustrated example, five trench portions 111 are formed along the first direction X, but the number of the trench portions 111 is not particularly limited, and at least one of the trench portions may be formed in the first region 101. Further, each of the trench portions may be provided on both the first main surface 110A side and the second main surface 110B side of the base member 110. It should be appreciated that although the method of forming each of the trench portions 111 is not particularly limited, dry etching using photolithography can be performed with a high aspect ratio, and the density of each of the trench portions 111 can be increased.

Moreover, the first conductor film 120 covers the second main surface 110B of the base member 110. The first conductor film 12 is provided using, for example, a metal material such as Mo (molybdenum), Al (aluminum), Au (gold), Ag (silver), Cu (copper), W (tungsten), Pt (platinum), Ti (titanium), Ni (nickel) or Cr (chromium). The first conductor film 120 is not limited to the metal material as long as it is a conductive material, and may be made of a conductive resin or the like. When the base member 110 is a low-resistance silicon substrate, the first conductor film 120 and the base member 110 function as the lower electrodes of the capacitor 100. When the base member 110 is an insulating substrate, the base member 110 functions as a part of a dielectric layer of the capacitor 100, and the first conductor film 120 functions as the lower electrode.

The dielectric film 130 is disposed in a region including the inside of the plurality of trench portions 111 at the side of the first main surface 110A. The dielectric film 130 has a first dielectric layer 131 and a second dielectric layer 132. The first dielectric layer 131 covers the first main surface 110A of the base member 110 as well as the bottom and inner side surfaces of the trench portion 111. The first dielectric layer 131 is provided using, for example, an insulating silicon oxide (for example, SiO$_2$). The film thickness of the first dielectric layer 131 is, for example, about 0.3 µm. When the base member 110 is a silicon substrate, the first dielectric layer 131 can be provided as a surface oxide film of the silicon substrate by thermally oxidizing the base member 110. Advantageously, the first dielectric layer 131 can improve the adhesion to the base member 110 underlying the dielectric film 130. Further, the first dielectric layer 131 can relieve the internal stress of the second dielectric layer 132 or the second conductor layer 142. Specifically, the first dielectric layer 131 is provided using silicon oxide having a compressive stress, so that it is possible to relieve the tensile stress of the second dielectric layer 132 made of silicon nitride or the tensile stress of the second conductor film 140 made of aluminum. In other words, the first dielectric layer 131 can suppress the damage of the dielectric film 130 due to the internal stress of the dielectric film 130 and the second conductor film 140, and can improve the reliability of the capacitor 100.

The second dielectric layer 132 is provided on the first dielectric layer 131. The second dielectric layer 132 is provided not only above the first main surface 110A of the base member 110 but also in a space formed on the first main surface 110A of the base member 110 by the trench portion 111. The second dielectric layer 132 is provided using a silicon nitride-based dielectric material such as silicon oxynitride (SiON) or silicon nitride (Si$_3$N$_4$). The film thickness of the second dielectric layer 132 is, for example, about 1 µm. The second dielectric layer 132 is provided, for example, by a vapor deposition method such as chemical vapor deposition (CVD) or physical vapor deposition (PVD). The second dielectric layer 132 is provided using a dielectric material having a dielectric constant higher than that of the first dielectric layer 131, so that it is possible to improve the capacitance density of the capacitor 100.

In general, internal stress occurs in the first dielectric layer 131 and the second dielectric layer 132. The internal stress of the first dielectric layer 131 is, for example, a residual stress remained as a thermal stress generated due to a difference in linear expansion coefficient between the base member 110 and the first dielectric layer 131. The same applies to the internal stress of the second dielectric layer 132. For example, the second dielectric layer 132 made of a silicon nitride has a tensile stress. For purposes of this disclosure the residual stress is hereinafter referred to as "internal stress". The larger the difference in linear expansion coefficient, the larger the internal stress caused by the thermal stress. The internal stress of the first dielectric layer 131 and the second dielectric layer 132 may lead to a deterioration of the insulation due to distortion of the capacitor 100 or damage to the first dielectric layer 131 or the second dielectric layer 132.

In one aspect, the dielectric film 130 can have a multilayer structure of three or more layers including another dielectric layer. The dielectric film 130 is formed in a multilayer structure, whereby the capacitance value, the withstand voltage, the internal stress, and the like can be adjusted more freely. For example, the dielectric film 130 may include a silicon nitride layer (the second dielectric layer 132) provided on the first dielectric layer 131 and a silicon oxide layer (a third dielectric layer) provided on the silicon nitride layer. The first dielectric layer 131 is not limited to a silicon oxide-based dielectric material, and may be provided using a dielectric material made of another oxide, silicon nitride or the like. Further, the second dielectric layer 132 is not limited to the silicon nitride-based dielectric material, and may be provided using a dielectric material made of an oxide such as Al$_2$O$_3$, HfO$_2$, Ta$_2$O$_5$ or ZrO$_2$.

The dielectric film 130 is formed along the bottom and inner side surfaces of the trench portion 111. In other words, the film thickness of the dielectric film 130 is smaller than the depth and width of the trench portion 111. As a result, the internal space of the trench portion 111 can be prevented from being filled with the dielectric film 130, and the capacitance density of the capacitor 100 can be improved by an increase in the area of opposed electrodes. In the example illustrated in FIG. 1, the dielectric film 130 is formed in a multilayer structure, and as a modified example, the dielectric film 130 may have a single layer structure. In this case, the dielectric film 130 may have a sufficient film thickness of, for example, 1 µm or more.

The second conductor film 140 is disposed on the dielectric film 130 in a region including the inside of each of the trench portions 111. Moreover, the second conductor film 140 is configured to function as the upper electrode of the capacitor 100, and forms a capacitance between the upper electrode and lower electrodes (the base member 110 and the first conductor film 120). In other words, the area in which the base member 110 and the second conductor film 140 are opposed to each other with the dielectric film 130 interposed therebetween corresponds to the area of opposed electrodes in the capacitor 100.

The second conductor film 140 has the first conductor layer 141 and the second conductor layer 142. The first conductor layer 141 is provided on the dielectric film 130, and is also provided in the space formed on the side of the first main surface 110A of the base member 110 by the trench portion 111. The first conductor layer 141 is provided in the first region 101 and the second region 102. The first conductor layer 141 is, for example, a p-type or n-type polycrystalline silicon (Poly-Si) film containing at least one of phosphorus (P), boron (B) or arsenic (As) as an impurity. The second conductor layer 142 is provided on the first conductor layer 141.

As further shown, the second conductor layer 142 is disposed on the first conductor layer 141. The second conductor layer 142 is provided in the first region 101, and the end portion of the first conductor layer 141 is exposed from the second conductor layer 142 in the second region 102. In other words, the first conductor layer 141 has the end portion extending outward beyond the second conductor layer 142 when viewed in a planar view from the normal direction of the first main surface 110A of the base member 110. The second conductor layer 142 is provided using, for example, Al, and has a tensile stress. The material of the second conductor layer 142 may be provided using the metal material mentioned as an example of the material forming the first conductor film 120. Further, the second conductor layer 142 is not limited to the metal material, and may be provided using a conductive material such as a conductive resin. The first conductor layer 141 and the second conductor layer 142 are provided by, for example, a vapor deposition method such as CVD or PVD.

Moreover, internal stress also occurs in the first conductor layer 141 and the second conductor layer 142. Since the linear expansion coefficient of Al as a metal material is larger than that of a dielectric material or a silicon-based semiconductor material, large internal stress may occur, particularly in the second conductor layer 142 provided using Al as compared with the first dielectric layer 131, the second dielectric layer 132, and the first conductor layer 141. Further, internal stress of the second conductor layer 142 is concentrated on the end portion of the second conductor layer 142 and is transmitted to the dielectric film 130, which may cause damage on the dielectric film 130.

According to the exemplary embodiment, the stress relieving layer or structure 160 is configured to relieve, for example, the transfer of internal stress concentrated on the end portion of the second conductor layer 142 to the dielectric film 130. The stress relieving layer 160 is provided on a part of a surface of the dielectric film 130 opposed to the first conductor layer 141 (hereinafter, also referred to as "upper surface 130A of the dielectric film 130"). The upper surface 130A of the dielectric film 130 includes both a region inside the first conductor layer 141 and also a region outside the first conductor layer 141 when the first main surface 110A of the base member 110 is viewed in a planar view.

As further shown, the stress relieving layer 160 is in contact with at least a part of the end portion of the first conductor layer 141. In this embodiment, the stress relieving layer 160 covers the upper surface and the end surface of the first conductor layer 141. The upper surface of the first conductor layer 141 is a surface of the first conductor layer 141 opposed to the second conductor layer 142. The end surface of the first conductor layer 141 is a surface connecting the surface of the first conductor layer 141 opposed to the dielectric film 130 and the surface opposed to the second conductor layer 142. The upper surface of the first conductor layer 141 includes both a region inside the second conductor layer 142 and also a region outside the second conductor layer 142 when the first main surface 110A of the base member 110 is viewed in a planar view. In other words, the stress relieving layer 160 is in contact with the entire surface of portions of the upper and end surfaces of the first conductor layer 141 that are exposed from the second conductor layer 142. The stress relieving layer 160 is also in contact with the second conductor layer 142. However, the stress relieving layer 160 can be in contact with at least a part of the end portion of the first conductor layer 141 in the second region 102 and does not necessarily cover the upper surface and the end surface. Further, the stress relieving layer 160 can be separated from the second conductor layer 142 and the dielectric film 130.

It is noted that the material of the stress relieving layer 160 is not particularly limited. For example, the stress relieving layer 160 can be provided using a dielectric material or a conductive material or may have a multilayer structure by laminating these materials. In the case where the first conductor layer 141 is a Poly-Si film, the stress relieving layer 160 is, for example, a film of silicon oxide provided by thermally oxidizing the first conductor layer 141. In this case, the stress relieving layer 160 contains the same impurity as the impurity contained in the first conductor layer 141. Further, the stress relieving layer 160 may be a film of silicon nitride deposited on the end portion of the first conductor layer 141 by the vapor deposition method. In this case, the stress relieving layer 160 contains hydrogen as an impurity. The silicon nitride can adjust the internal stress depending on the production method and composition. For example, the composition ratio of silicon (Si) to nitrogen (N) is set to 1 or less, as a result of which the stress relieving layer 160 made of silicon nitride has a compressive stress. The method of forming the stress relieving layer 160 is not limited to the above method. For example, a part of the second dielectric layer 132 may be altered by impurity implantation to form a stress relieving region in the dielectric film 130. Further, a part of the second conductor layer 142 may be altered by oxidation or the like, and the resulting layer may be used as the stress relieving layer 160.

According to the exemplary embodiment, the direction of the internal stress of the stress relieving layer 160 is opposite to the direction of the internal stress of the second conductor layer 142. In other words, the stress relieving layer 160 has a compressive stress in the case where the second conductor layer 142 has a tensile stress, and the stress relieving layer 160 has a tensile stress in the case where the second conductor layer 142 has a compressive stress.

Moreover, the protective film 150 covers the end portion of the second conductor film 140 and the stress relieving layer 160 when viewed in a planar view from the normal direction of the first main surface 110A of the base member 110. The protective film 150 protects the second conductor film 140 and the stress relieving layer 160 from external stress. The protective film 150 is, for example, a polyimide (PI) film, and may be another organic insulator film or an inorganic insulator film such as silicon oxide or silicon nitride. The protective film 150 can suppress the generation of the leak current due to the creeping discharge. In other words, the withstand voltage of the capacitor 100 can be increased. Further, the protective film 150 can relieve the internal stress of the dielectric film 130 and the second conductor film 140. For example, the tensile stress of the second dielectric layer 132 made of silicon nitride or the tensile stress of the second conductor layer 142 made of Al can be relieved by the compressive stress of the protective film 150. Thus, damage to the dielectric film 130 can be suppressed, and the reliability of the capacitor 100 can be improved. In the case where the dielectric constant of the protective film 150 is larger than that of the dielectric film 130, it is possible to suppress the leakage electric field from the second conductor film 140. Conversely, in the case where the dielectric constant of the protective film 150 is smaller than that of the dielectric film 130, it is possible to reduce the formation of parasitic capacitance through the second conductor film 140.

As illustrated in FIG. 2, a thickness T6 of the stress relieving layer 160 (i.e., in the thickness or vertical direction of the capacitor) is smaller than a thickness T4 of the second conductor film 140 outside the trench portion 111, on the first main surface 110A of the base member 110. Further, a thickness T5 of the protective film 150 is larger than the thickness T4 of the second conductor film 140. For purposes of this disclosure, the thickness T6 of the stress relieving layer 160, the thickness T4 of the second conductor film 140, and the thickness T5 of the protective film 150 refer to a thickness along the third direction Z, i.e., the vertical direction of the capacitor (hereinafter, simply referred to as "thickness"). In other words, the thickness T4 corresponds to the height from the upper surface 130A of the dielectric film 130 to the upper surface 140A of the second conductor film 140, the thickness T6 corresponds to the height from the first conductor layer 141 to the upper surface 160A of the stress relieving layer 160, and the thickness T5 corresponds to the height from the upper surface 130A of the dielectric film 130 to the upper surface 150A of the protective film 150. Further, in other words, with reference to the position of each of the upper surfaces, the upper surface 140A of the second conductor film 140 is higher than the upper surface 160A of the stress relieving layer 160, and the upper surface 150A of the protective film 150 is higher than the upper surface 140A of the second conductor film 140, based on the upper surface 130A of the dielectric film 130.

Figure 3:
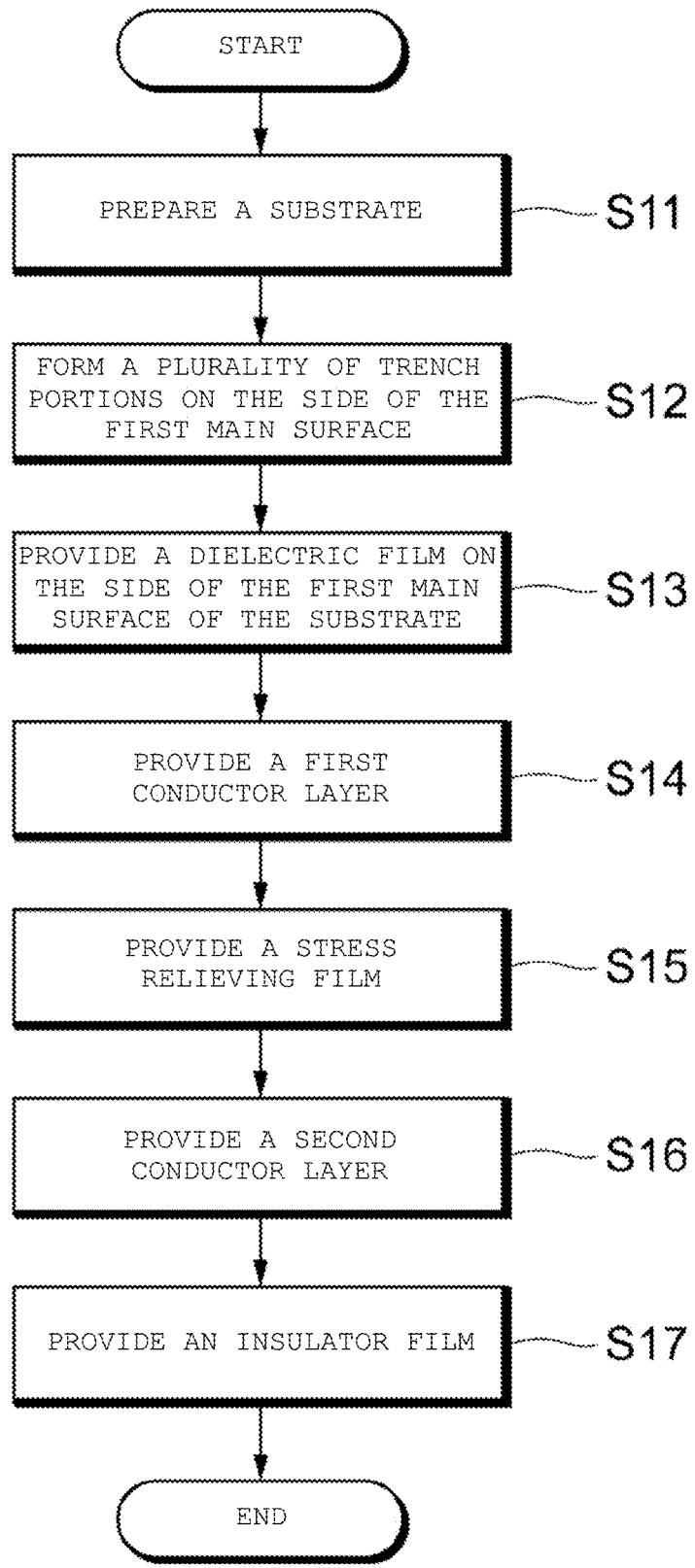
FIG. 3 is a flowchart illustrating a method of producing the capacitor according to the first exemplary embodiment.
Figure 4:
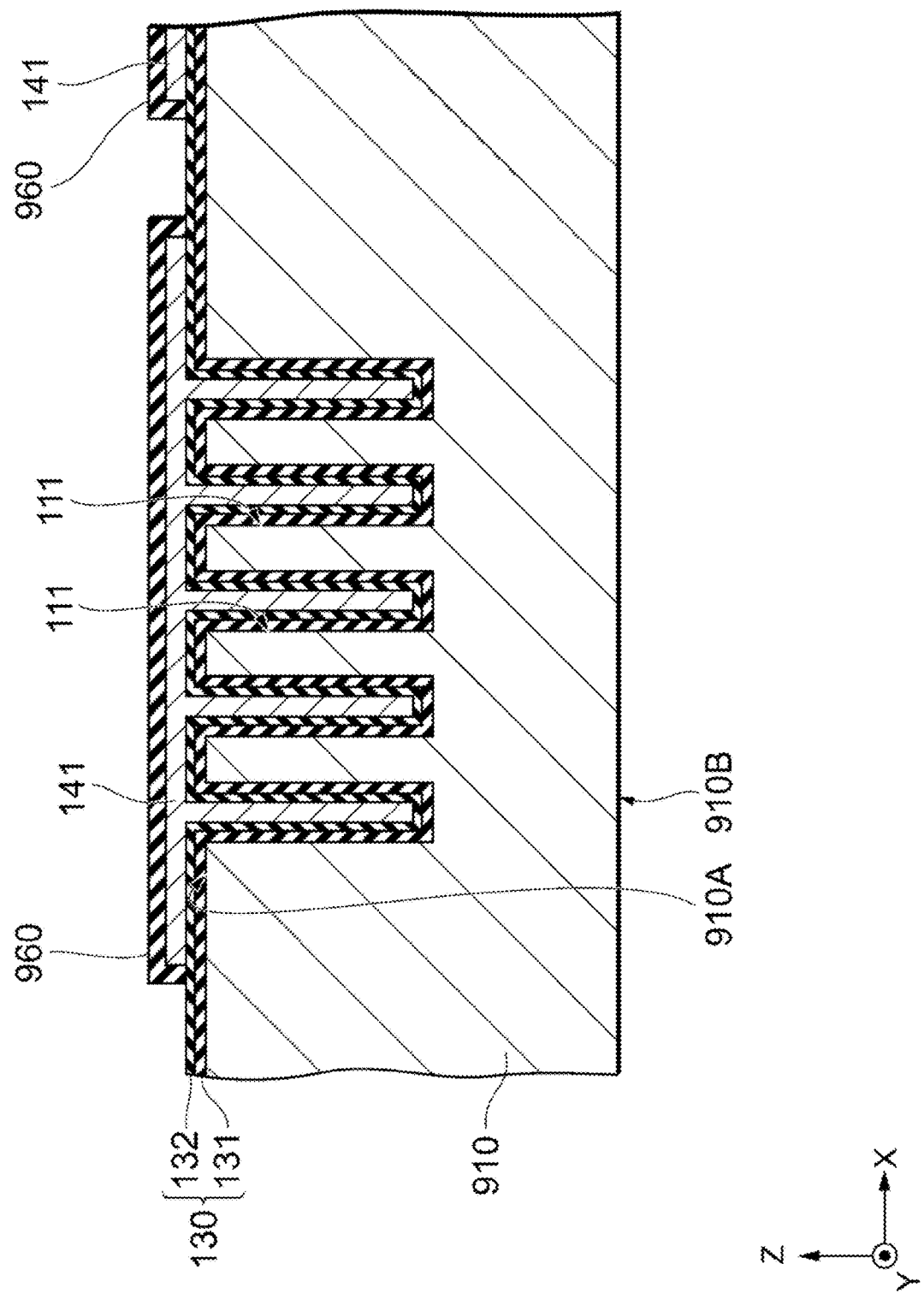
FIG. 4 is a cross-sectional view illustrating a step of providing a $SiO_2$ film on a first conductor layer.
Figure 5:
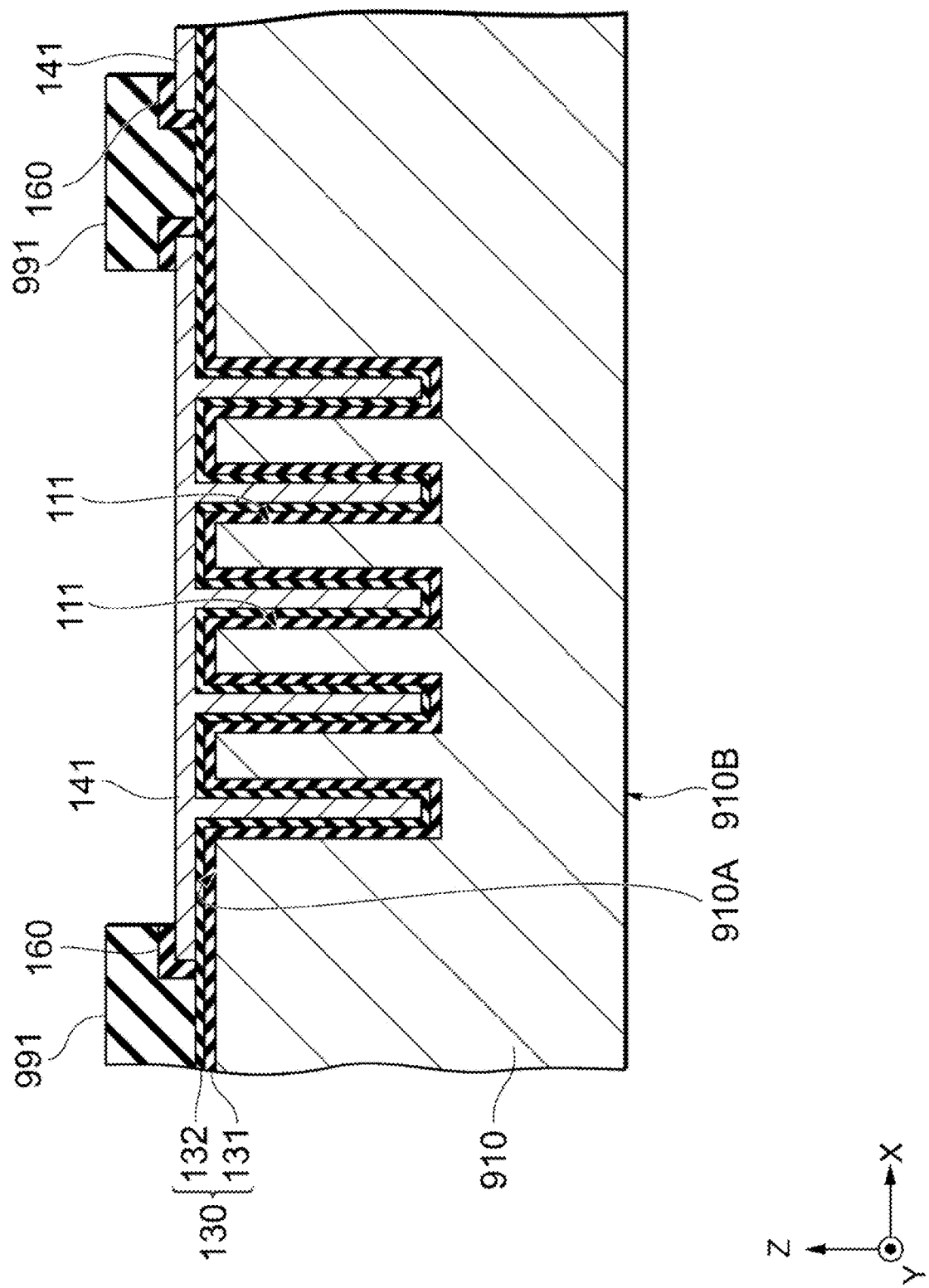
FIG. 5 is a cross-sectional view illustrating a step of patterning the $SiO_2$ film to provide the stress relieving layer.
Figure 6:
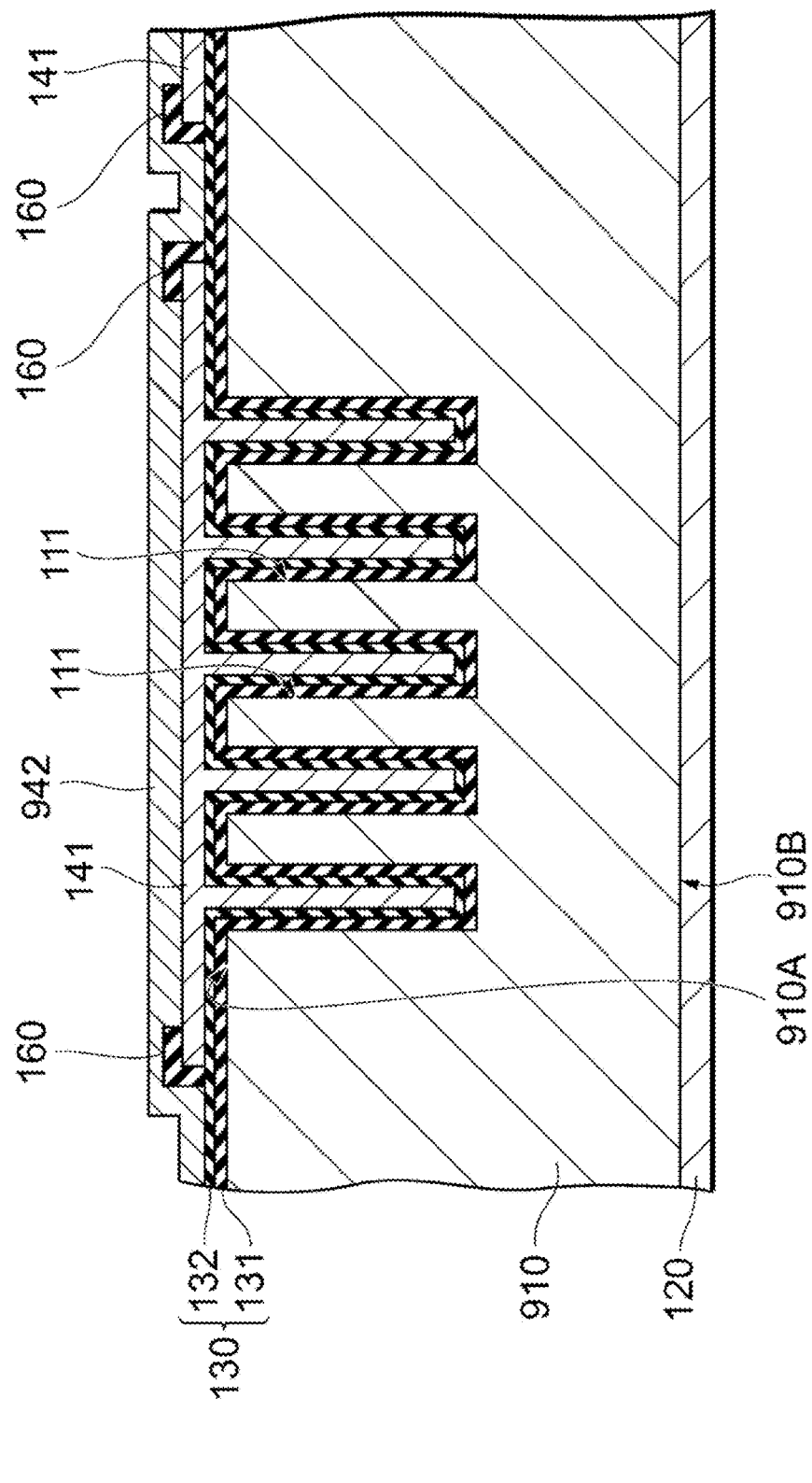
FIG. 6 is a cross-sectional view illustrating a step of providing an Al film on the first conductor layer.
Figure 7:
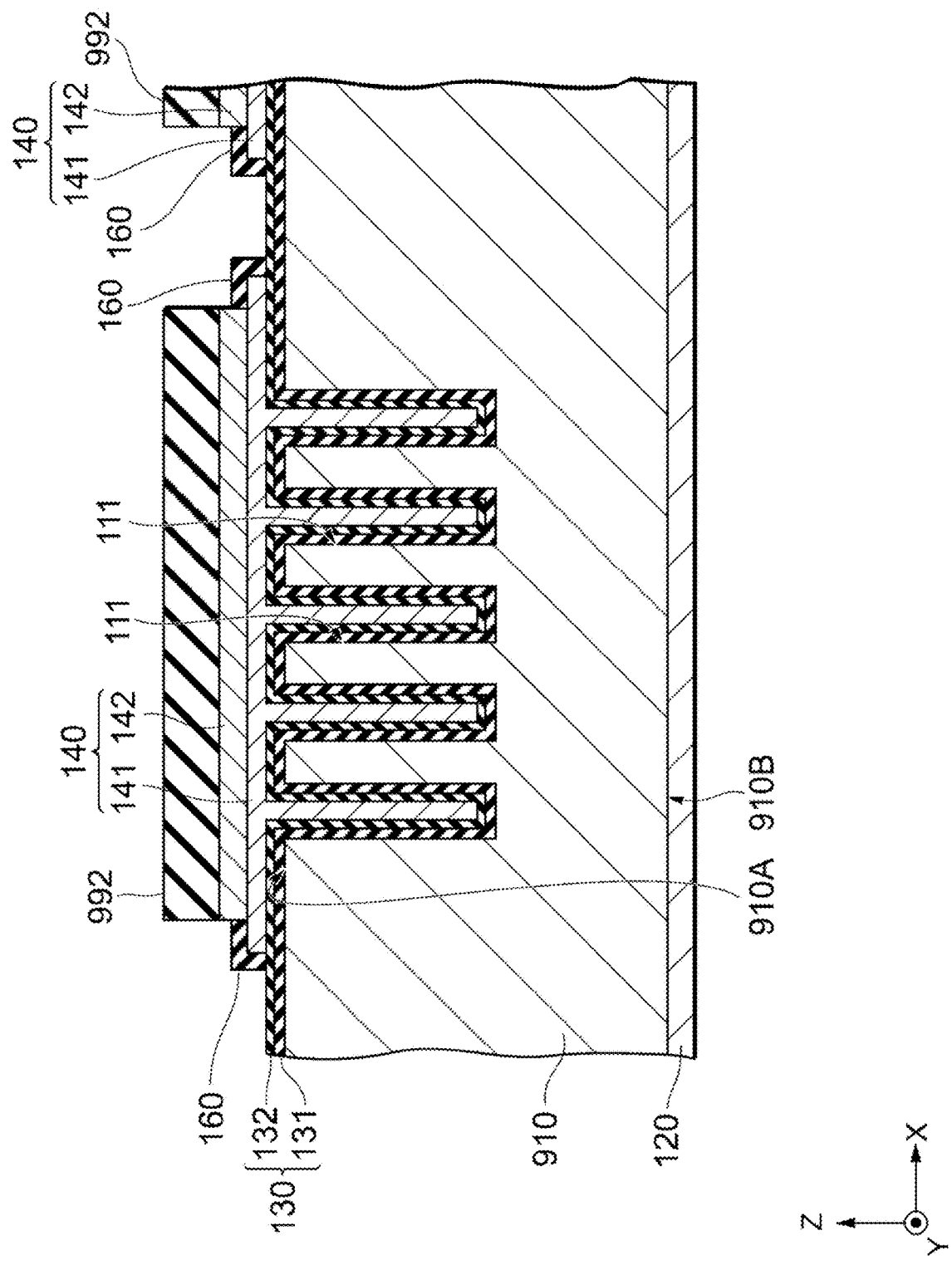
FIG. 7 is a cross-sectional view illustrating a step of patterning the Al film to provide the first conductor layer.
Figure 8:
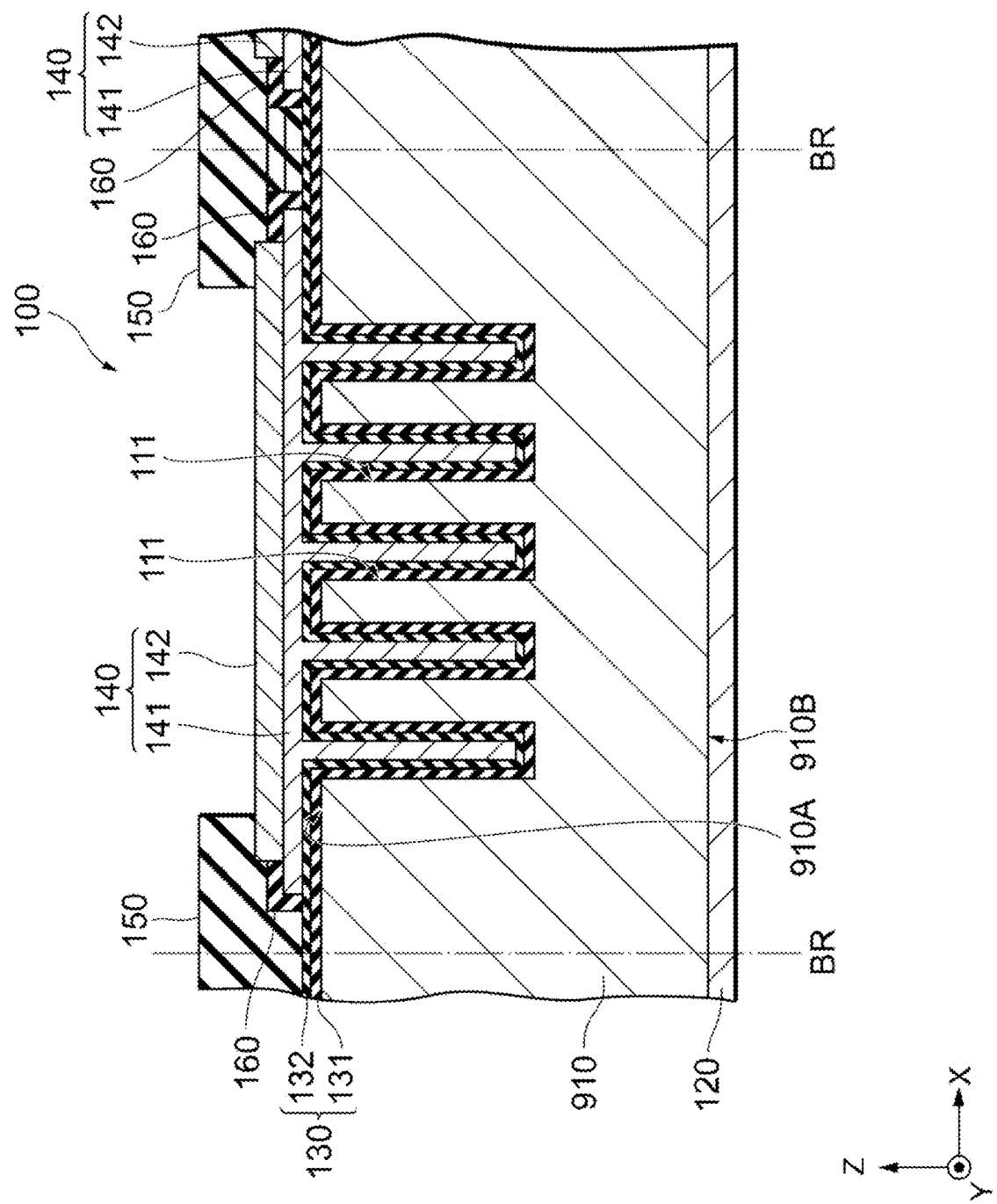
FIG. 8 is a cross-sectional view illustrating a step of providing a protective film so as to cover an end portion of a second conductor film and the stress relieving layer.

Subsequently, an example of a method of producing the capacitor 100 according to the first exemplary embodiment will be described with reference to FIGS. 3 to 7. FIG. 3 is a flowchart illustrating a method of producing the capacitor according to the first exemplary embodiment. FIG. 4 is a cross-sectional view illustrating a step of providing a $SiO_2$ film on a first conductor layer. FIG. 5 is a cross-sectional view illustrating a step of patterning the $SiO_2$ film to provide the stress relieving layer. FIG. 6 is a cross-sectional view illustrating a step of providing an Al film on the first conductor layer. FIG. 7 is a cross-sectional view illustrating a step of patterning the Al film to provide the first conductor layer. FIG. 8 is a cross-sectional view illustrating a step of providing a protective film so as to cover an end portion of a second conductor film and the stress relieving layer.

In producing the capacitor 100, first, a substrate 910 is prepared (S11). The substrate 910 is a low-resistance silicon substrate and corresponds to a collective board in which a plurality of base members 110 are connected. For example, a plate-like wafer is cut from an ingot, the thickness adjustment and the surface flattening are performed on the wafer by a polishing process such as chemical mechanical polishing, and the resulting wafer is used as a low-resistance silicon substrate 910.

Then, the plurality of trench portions 111 are formed on the side of a first main surface 910A of the substrate 910 (S12). For example, a photoresist layer patterned by photolithography is used, and a part of the low-resistance silicon substrate 910 in the region corresponding to the base member 110 is removed by dry etching such as a reactive ion etching (RIE) method to form each of the trench portions 111. The method of forming the trench portions 111 is not particularly limited, and may be a method of removing a part of the low-resistance silicon substrate 910 by wet etching. Dry etching enables deep etching with a high aspect ratio in the direction perpendicular to the first main surface 910A of the low-resistance silicon substrate 910 as compared with wet etching, and thus the capacitance value of the capacitor 100 can be increased by increasing the density of the plurality of trench portions 111.

Then, the dielectric film 130 is provided on the side of the first main surface 910A of the substrate 910 (S13). In this step, first, the surface of the low-resistance silicon substrate 910 is thermally oxidized by heat treatment at 800° C. to 1100° C. to form a $SiO_2$ film corresponding to the first dielectric layer 131. Next, a $Si_3N_4$ film corresponding to the second dielectric layer 132 is formed on the $SiO_2$ film by reduced pressure CVD (LP-CVD). The $Si_3N_4$ film is grown under a low pressure environment by setting the temperature of the low-resistance silicon substrate 910 to 650° C. to 800° C. and thermally reacting a reaction gas including $SiH_2Cl_2$ (dichlorosilane) and $NH_3$ (ammonia) on the $SiO_2$ film.

Then, the first conductor layer 141 is provided (S14). In this step, first, a Poly-Si (polycrystalline silicon) film is formed on the second dielectric layer 132 by a reduced pressure CVD method. The Poly-Si film is grown under a low pressure environment by setting the temperature of the low-resistance silicon substrate 910 to 550° C. to 650° C. and thermally reacting a reaction gas including $SiH_4$ (silane). Next, as illustrated in FIG. 4, a photoresist layer patterned by photolithography is used, and the Poly-Si film is etched so as to remain in a region overlapping with the plurality of trench portions 111. The patterned Poly-Si film corresponds to the first conductor layer 141. Thereafter, the photoresist layer is removed by asking, and the dielectric film 130 and the first conductor layer 141 are cleaned with a rinse solution of ultrapure water.

Then, the stress relieving layer 160 is provided (S15). In this step, first, as illustrated in FIG. 4, the Poly-Si film of the first conductor layer 141 is thermally oxidized to form a $SiO_2$ film 960 on the surface of the first conductor layer 141. Then, a photoresist layer 991 patterned by photolithography is provided. As illustrated in FIG. 5, the photoresist layer 991 is provided so as to avoid the region overlapping with the plurality of trench portions 111 and overlap with the end portion of the Poly-Si film. Then, a part of the $SiO_2$ film 960 is removed by wet etching using the photoresist layer 991. The patterned $SiO_2$ film 960 remains on the end portion of the first conductor layer 141. The $SiO_2$ film 960 remained by etching corresponds to the stress relieving layer 160. When viewed in a planar view from the normal direction of the first main surface 910A of the low-resistance silicon substrate 910, the $SiO_2$ film 960 is removed from the surface of the first conductor layer 141 and the first conductor layer 141 is exposed, in the region surrounded by the stress relieving layer 160. Thereafter, the photoresist layer 991 is removed and cleaned. In the case where the stress relieving layer 160 is silicon nitride, the layer is formed by depositing silicon nitride on the Poly-Si film by, for example, reduced pressure CVD, instead of thermal oxidation.

Then, the second conductor layer 142 is provided (S16). In this step, first, as illustrated in FIG. 6, an Al film 942 is provided on the dielectric film 130, the first conductor layer 141, and the stress relieving layer 160. The Al film 942 is formed, for example, by sputtering. Next, as illustrated in FIG. 7, a photoresist layer 992 patterned by photolithography is provided. The photoresist layer 992 is provided so as to overlap with the region surrounded by the stress relieving layer 160 when viewed in a planar view from the normal direction of the first main surface 910A of the low-resistance silicon substrate 910. Then, a part of the Al film 942 is removed by etching. The patterned Al film 942 remains inside of the end portion of the first conductor layer 141 when viewed in a planar view from the normal direction of the first main surface 910A of the low-resistance silicon substrate 910. The Al film 942 remained by etching corresponds to the second conductor layer 142. Thereafter, the photoresist layer 992 is removed and cleaned. The patterning of the Al film 942 is not limited to removal by etching. For example, it may be a liftoff process in which the $SiO_2$ film 960 is removed, the Al film 942 is formed on the photoresist layer 991, and an unnecessary portion of the Al film 942 is removed together with the photoresist layer 991.

Then, the protective film 150 is provided (S17). The photoresist layer 992 is removed, and then a polyimide (PI) film is formed by a spin-coating process. Then, the PI film is etched using a photoresist layer patterned by photolithography. The PI film is removed by etching, leaving a region overlapping with the dielectric film 130, the end portion of the second conductor layer 142, and the stress relieving layer 160. The PI film remained by etching corresponds to the protective film 150. The method of forming the PI film is not limited to the spin-coating process, and it is possible to use a wet process such as an inkjet process, a dispensing process, a screen printing process, a flexographic printing process, a gravure printing process or an offset printing process. The same applies to the case where the protective film 150 is provided using an organic insulator film other than the PI film. In the case where the protective film 150 is provided using an inorganic insulator film such as silicon nitride, it is possible to use various dry processes such as CVD and PVD.

After the formation of the protective film 150, the low-resistance silicon substrate 910 is cut into a plurality of capacitors 100 along a dicing line BR passing through the protective film 150. The dicing process is not particularly limited, and the process is performed by the general method using a dicing saw and a laser.

Subsequently, additional exemplary embodiments will now be described. In the following exemplary embodiments, descriptions of matters common to those of the first embodiment are omitted, and only different points will be described. The configurations denoted by the same reference numerals as those in the first embodiment have the same configurations and functions as those in the first exemplary embodiment, and the detailed description will be omitted. The same operation and effect by the same configuration will not be described.

Second Exemplary Embodiment

Figure 9:
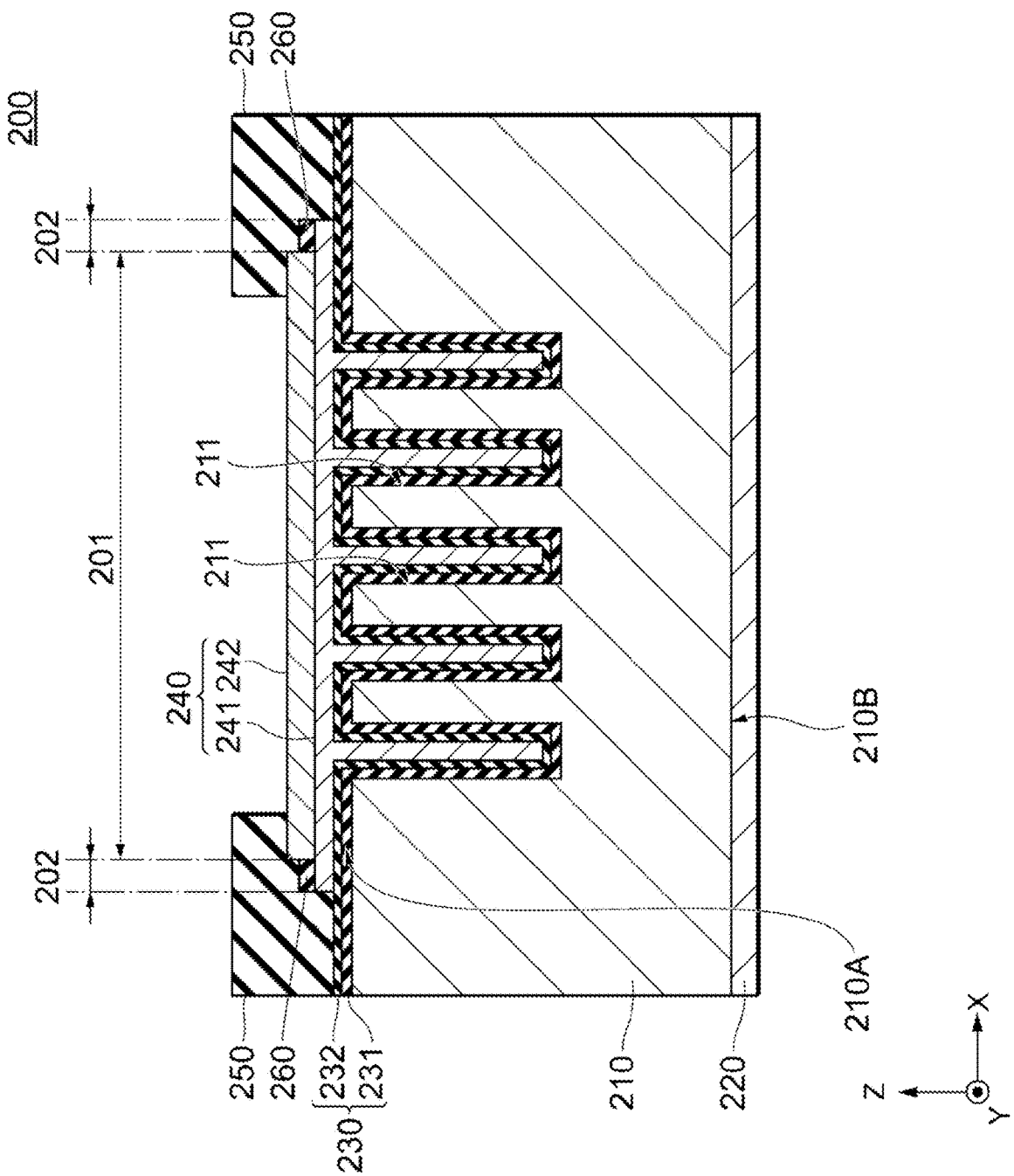
FIG. 9 is a cross-sectional view schematically illustrating a configuration of a capacitor according to a second exemplary embodiment.

A configuration of a capacitor 200 according to a second exemplary embodiment will be described with reference to FIG. 9. FIG. 9 is a cross-sectional view schematically illustrating the configuration of the capacitor according to the second embodiment.

As shown, the capacitor 200 according to the second exemplary embodiment includes a base member 210, a first conductor film 220, a dielectric film 230 having a first dielectric layer 231 and a second dielectric layer 232, a second conductor film 240 having a first conductor layer 241 and a second conductor layer 242, a protective film 250, and a stress relieving layer 260, similarly to the capacitor 100 according to the first embodiment. The base member 210 has a first main surface 210A located on the side of the dielectric film 230 and a second main surface 210B located on the side of the first conductor film 220, and the trench portions 211 are formed on the side of the first main surface 210A of the base member 210. When the first main surface 210A of the base member 210 is viewed in a planar view, the capacitor 200 has a first region 201 which overlaps with the second conductor layer 242 and a second region 202 which overlaps with the end portion of the first conductor layer 241 extending outward beyond the second conductor layer 242.

The capacitor 200 according to the second embodiment is different from the capacitor 100 according to the first embodiment in that the stress relieving layer 260 is in contact with only the upper surface without being in contact with the end surface at the end portion of the first conductor layer 241. The stress relieving layer 260 is separated from the dielectric film 230, covers the upper surface of the end portion of the first conductor layer 241, and is in contact with the end surface of the second conductor layer 242. Thus, the stress relieving layer 260 does not necessarily cover the entire surface of the end portion of the first conductor layer 241 and may be separated from the dielectric film 230 as long as the stress relieving layer 260 is in contact with at least a part of the end portion of the first conductor layer 241.

Third Exemplary Embodiment

Figure 10:
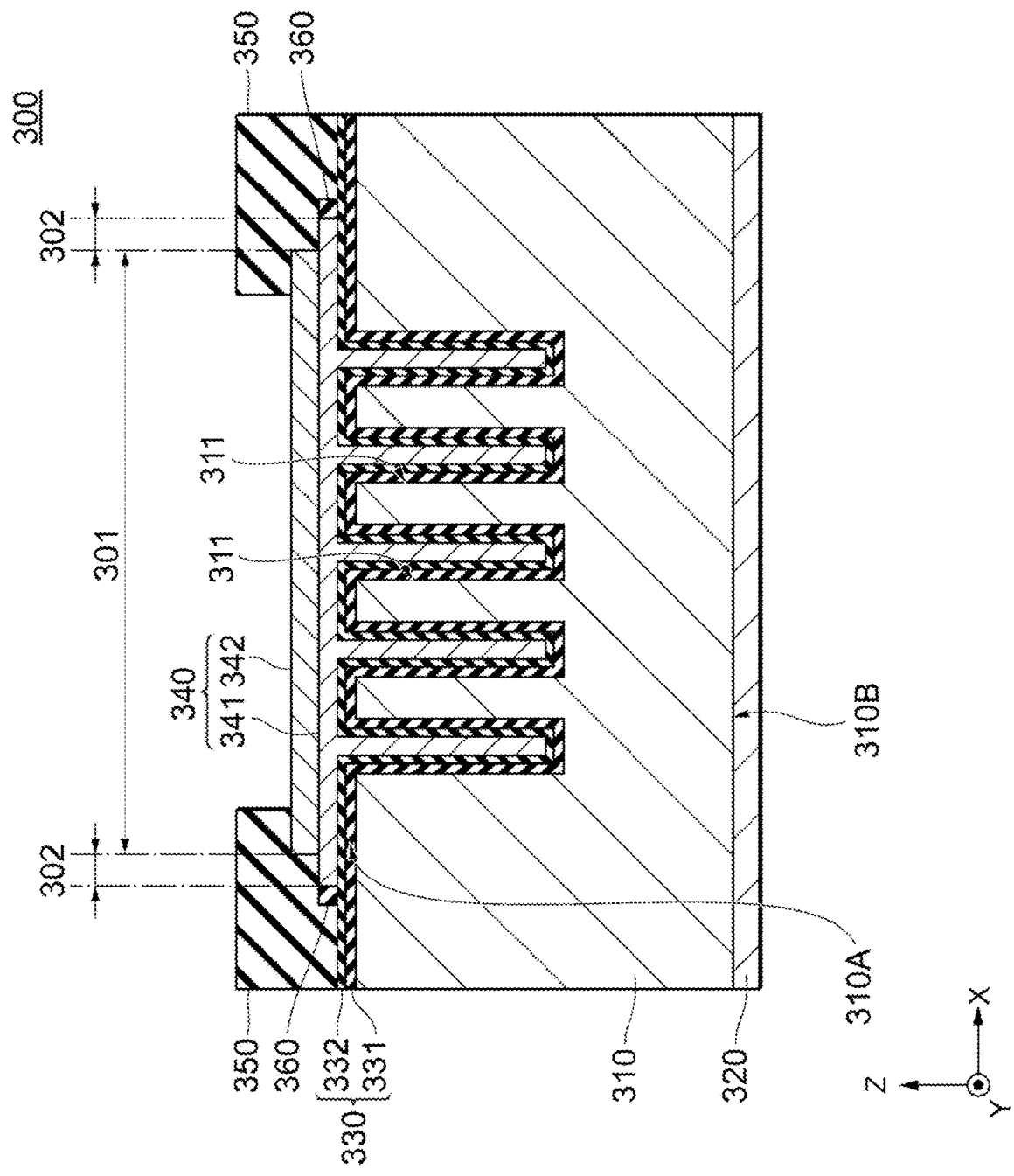
FIG. 10 is a cross-sectional view schematically illustrating a configuration of a capacitor according to a third exemplary embodiment.

A configuration of a capacitor 300 according to a third exemplary embodiment will be described with reference to FIG. 10. FIG. 10 is a cross-sectional view schematically illustrating the configuration of the capacitor according to the third embodiment.

The capacitor 300 according to the third embodiment includes a base member 310, a first conductor film 320, a dielectric film 330 having a first dielectric layer 331 and a second dielectric layer 332, a second conductor film 340 having a first conductor layer 341 and a second conductor layer 342, a protective film 350, and a stress relieving layer 360, similarly to the capacitor 100 according to the first embodiment. The base member 310 has a first main surface 310A located on the side of the dielectric film 330 and a second main surface 310B located on the side of the first conductor film 320, and the trench portions 311 are formed on the side of the first main surface 310A of the base member 310. When the first main surface 310A of the base member 310 is viewed in a planar view, the capacitor 300 has a first region 301 which overlaps with the second conductor layer 342 and a second region 302 which overlaps with the end portion of the first conductor layer 341 extending outward beyond the second conductor layer 342.

The capacitor 300 according to the third embodiment is different from the capacitor 100 according to the first embodiment in that the stress relieving layer 360 is in contact with only the end surface without being in contact with the upper surface at the end portion of the first conductor layer 341. The stress relieving layer 360 is not in contact with the second conductor layer 342.

Fourth Exemplary Embodiment

Figure 11:
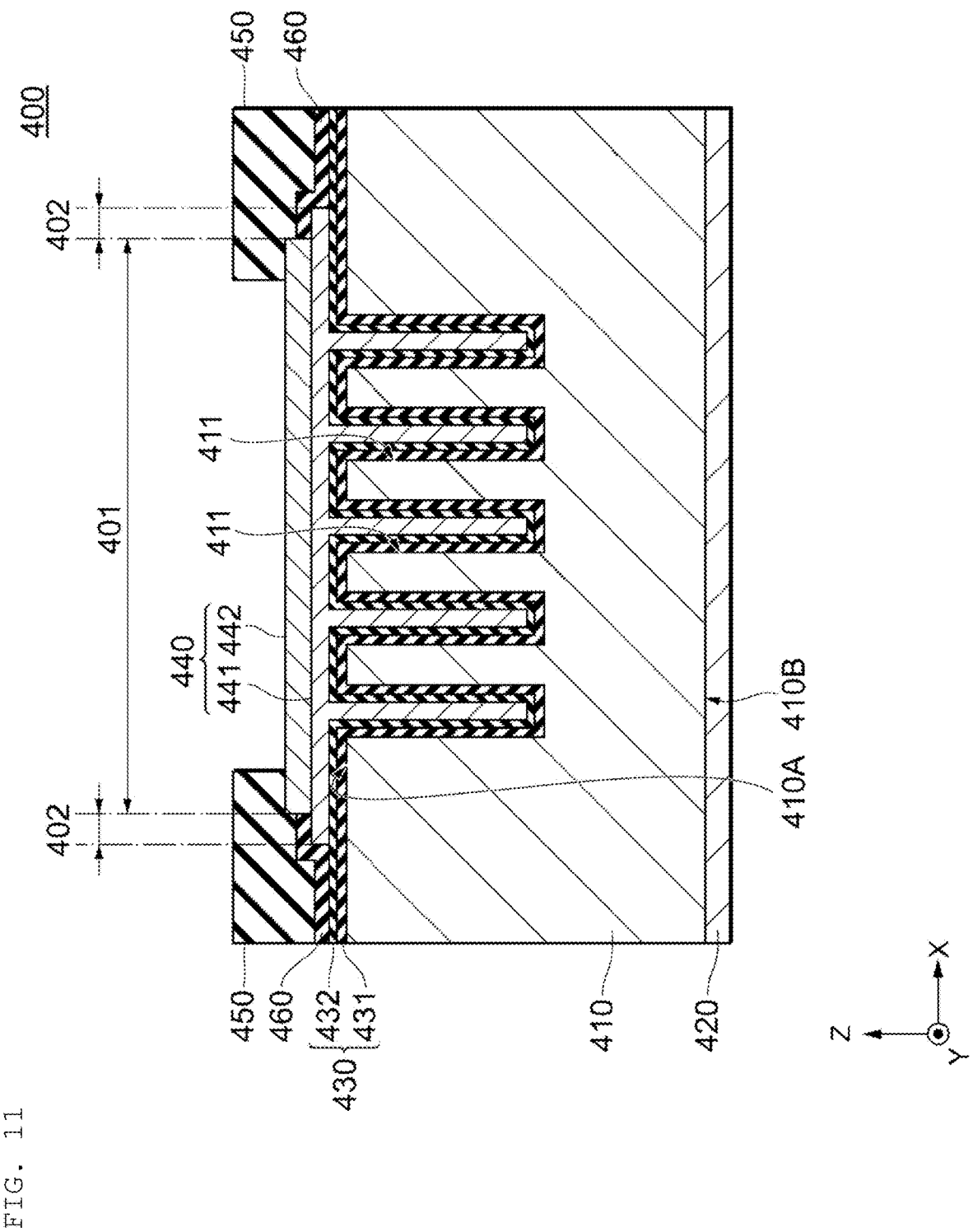
FIG. 11 is a cross-sectional view schematically illustrating a configuration of a capacitor according to a fourth exemplary embodiment.

A configuration of a capacitor 400 according to a fourth exemplary embodiment will be described with reference to FIG. 11. FIG. 11 is a cross-sectional view schematically illustrating the configuration of the capacitor according to the fourth embodiment.

The capacitor 400 according to the fourth embodiment includes a base member 410, a first conductor film 420, a dielectric film 430 having a first dielectric layer 431 and a second dielectric layer 432, a second conductor film 440 having a first conductor layer 441 and a second conductor layer 442, a protective film 450, and a stress relieving layer 460, similarly to the capacitor 100 according to the first embodiment. The base member 410 has a first main surface 410A located on the side of the dielectric film 430 and a second main surface 410B located on the side of the first conductor film 420, and trench portions 411 are formed on the side of the first main surface 410A of the base member 410. When the first main surface 410A of the base member 410 is viewed in a planar view, the capacitor 400 has a first region 401 which overlaps with the second conductor layer 442 and a second region 402 which overlaps with the end portion of the first conductor layer 441 extending outward beyond the second conductor layer 442.

The capacitor 400 according to the fourth embodiment is different from the capacitor 100 according to the first embodiment in that the stress relieving layer 460 is provided from the end portion of the second conductor film 440 to the end portion of the capacitor 400. At this time, the protective film 450 is provided on the second conductor film 440 and the stress relieving layer 460.

Fifth Exemplary Embodiment

Figure 12:
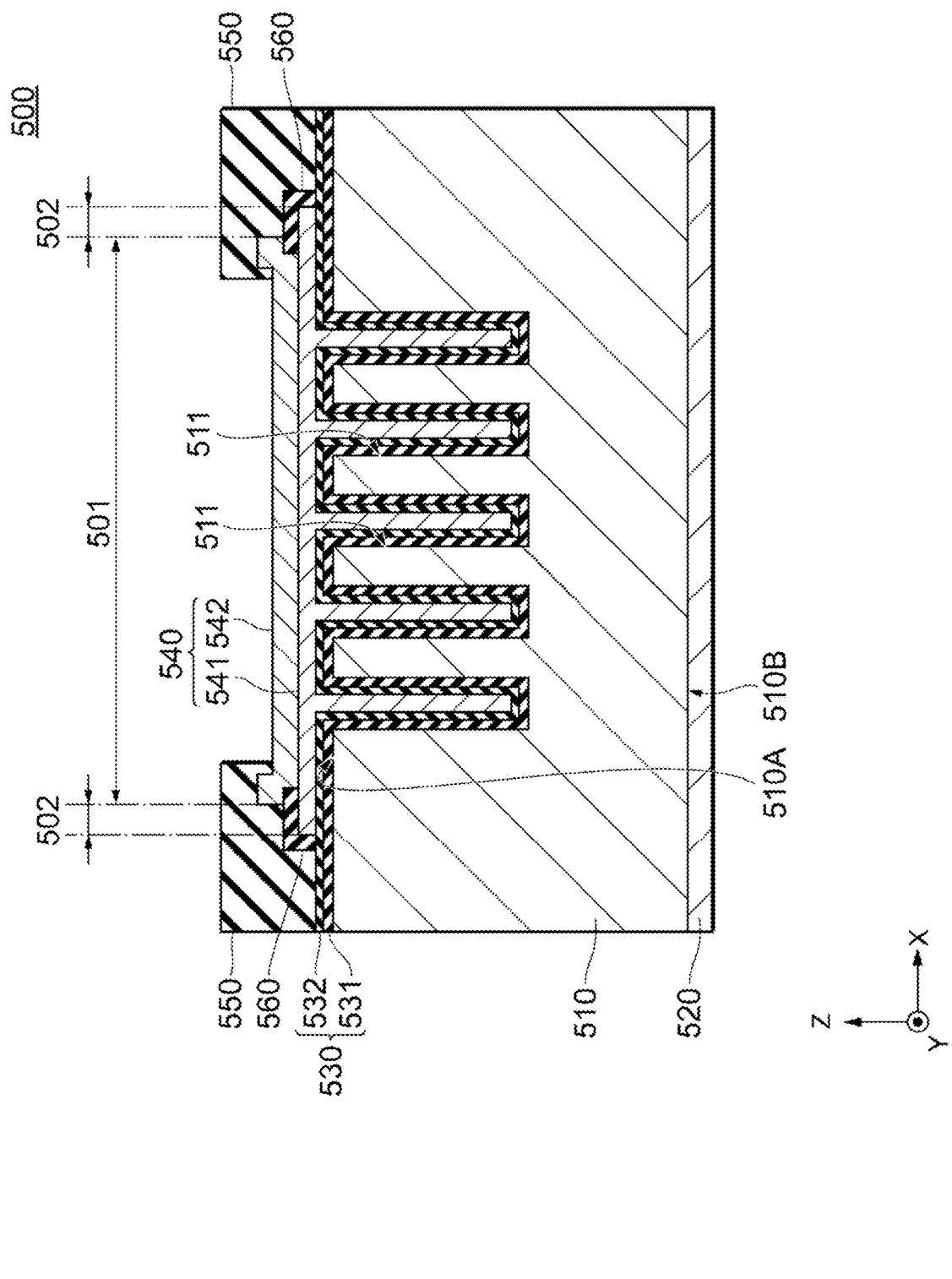
FIG. 12 is a cross-sectional view schematically illustrating a configuration of a capacitor according to a fifth exemplary embodiment.

A configuration of a capacitor 500 according to a fifth exemplary embodiment will be described with reference to FIG. 12. FIG. 12 is a cross-sectional view schematically illustrating the configuration of the capacitor according to the fifth embodiment.

As shown, the capacitor 500 according to the fifth embodiment includes a base member 510, a first conductor film 520, a dielectric film 530 having a first dielectric layer 531 and a second dielectric layer 532, a second conductor film 540 having a first conductor layer 541 and a second conductor layer 542, a protective film 550, and a stress relieving layer 560, similarly to the capacitor 100 according to the first embodiment. The base member 510 has a first main surface 510A located on the side of the dielectric film 530 and a second main surface 510B located on the side of the first conductor film 520, and trench portions 511 are formed on the side of the first main surface 510A of the base member 510. When the first main surface 510A of the base member 510 is viewed in a planar view, the capacitor 500 has a first region 501 which overlaps with the second conductor layer 542 and a second region 502 which overlaps with the end portion of the first conductor layer 541 extending outward beyond the second conductor layer 542.

The capacitor 500 according to the fifth embodiment is different from the capacitor 100 according to the first embodiment in that the end portion of the second conductor layer 542 is provided on the stress relieving layer 560. The stress relieving layer 560 is provided between the first conductor layer 141 and the second conductor layer 142.

Sixth Exemplary Embodiment

Figure 13:
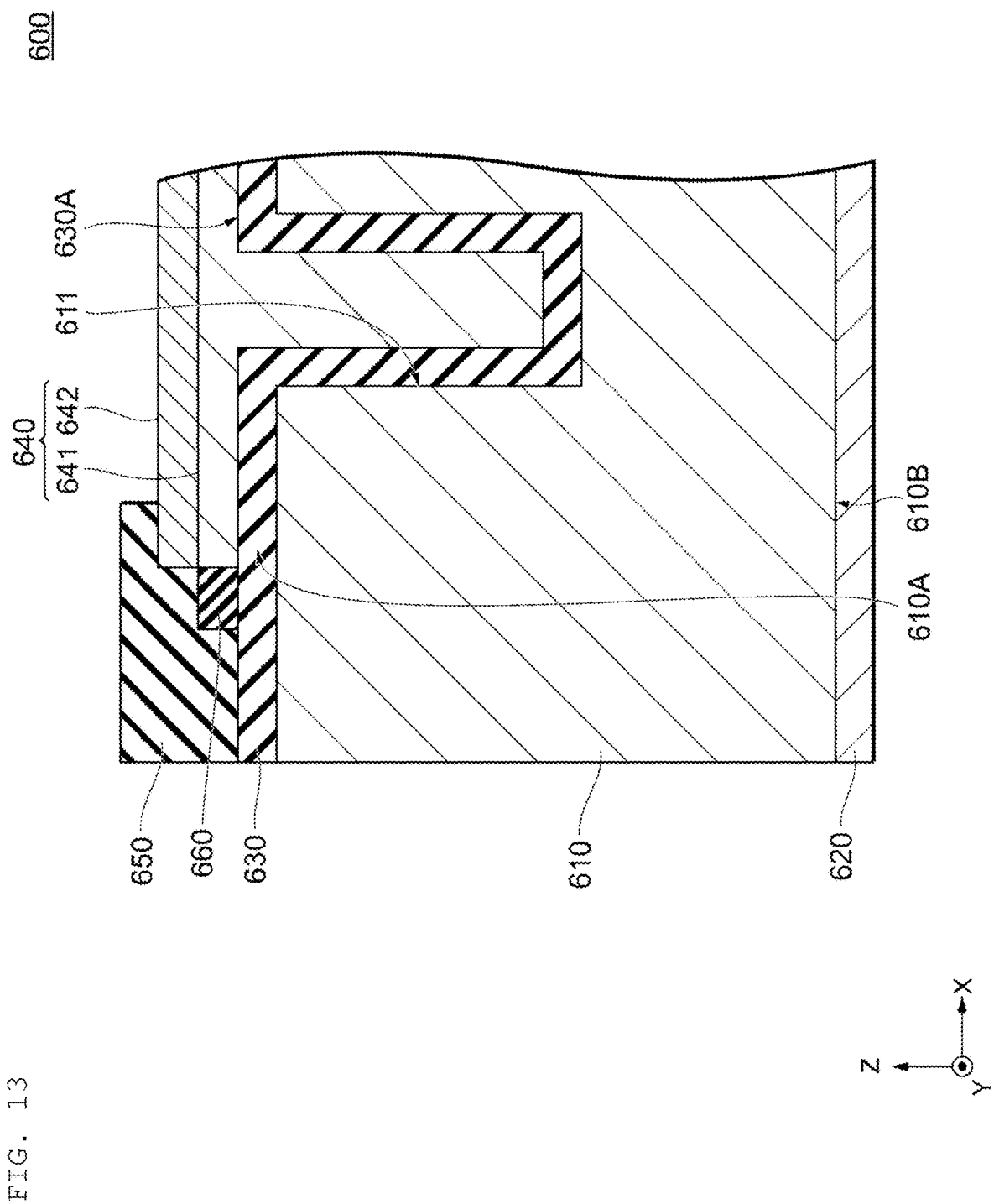
FIG. 13 is a cross-sectional view schematically illustrating a configuration of a capacitor according to a sixth exemplary embodiment.

A configuration of a capacitor 600 according to a sixth exemplary embodiment will be described with reference to FIG. 13. FIG. 13 is a cross-sectional view schematically illustrating the configuration of the capacitor according to the sixth embodiment.

The capacitor 600 according to the sixth embodiment includes a base member 610, a first conductor film 620, a dielectric film 630, a second conductor film 640 having a first conductor layer 641 and a second conductor layer 642, a protective film 650, and a stress relieving layer 660, similarly to the capacitor 100 according to the first embodiment. The base member 610 has a first main surface 610A located on the side of the dielectric film 630 and a second main surface 610B located on the side of the first conductor film 620, and a trench portion 611 is formed on the side of the first main surface 610A of the base member 610. The dielectric film 630 has an upper surface 630A located on the side of the second conductor film 640.

The capacitor 600 according to the sixth embodiment is different from the capacitor 300 according to the third embodiment in that at least a part of the outer edge of each of the first conductor layer 641 and the second conductor layer 642 coincides with each other when the first main surface 610A of the base member 610 is viewed in a planar view. In other words, the end surface of the first conductor layer 641 coincides with the end surface of the second conductor layer 642 in a region where the stress relieving layer 660 is provided.

The stress relieving layer 660 is provided on a part of the upper surface 630A of the dielectric film 630. When the first main surface 610A of the base member 610 is viewed in a planar view, the stress relieving layer 660 is provided in a region outside the first conductor layer 641, and is in contact with the end surface of the first conductor layer 641. The thickness of the stress relieving layer 660 is approximately equal to the thickness of the first conductor layer 641. The stress relieving layer 660 is formed, for example, by oxidizing the end portion of the first conductor layer 641 exposed from the second conductor layer 642 when the first main surface 610A of the base member 610 is viewed in a planar view.

The thickness of the stress relieving layer 660 and the formation method thereof are not limited to those described above. The thickness of the stress relieving layer 660 may be larger than the thickness of the first conductor layer 641. In other words, the stress relieving layer 660 may be in contact with the end surface of the second conductor layer 642. The thickness of the stress relieving layer 660 may be smaller than the thickness of the first conductor layer 641. The stress relieving layer 660 may be formed, for example, by forming a projection portion on the dielectric film 630 and altering the projection portion. Alternatively, an insulating material may be deposited on the dielectric film 730 to form the stress relieving layer 660.

Seventh Exemplary Embodiment

Figure 14:
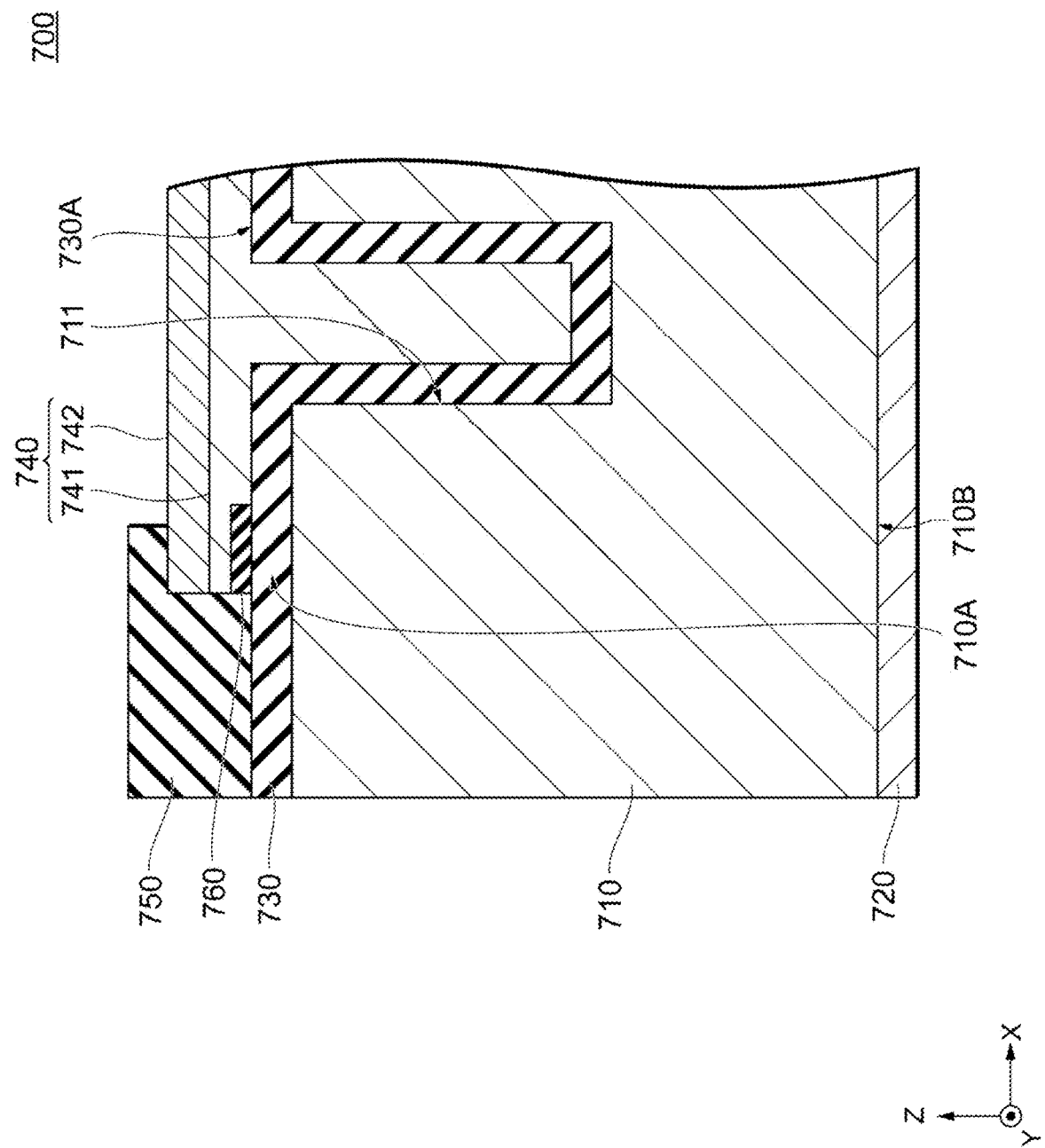
FIG. 14 is a cross-sectional view schematically illustrating a configuration of a capacitor according to a seventh exemplary embodiment.
Figure 15:
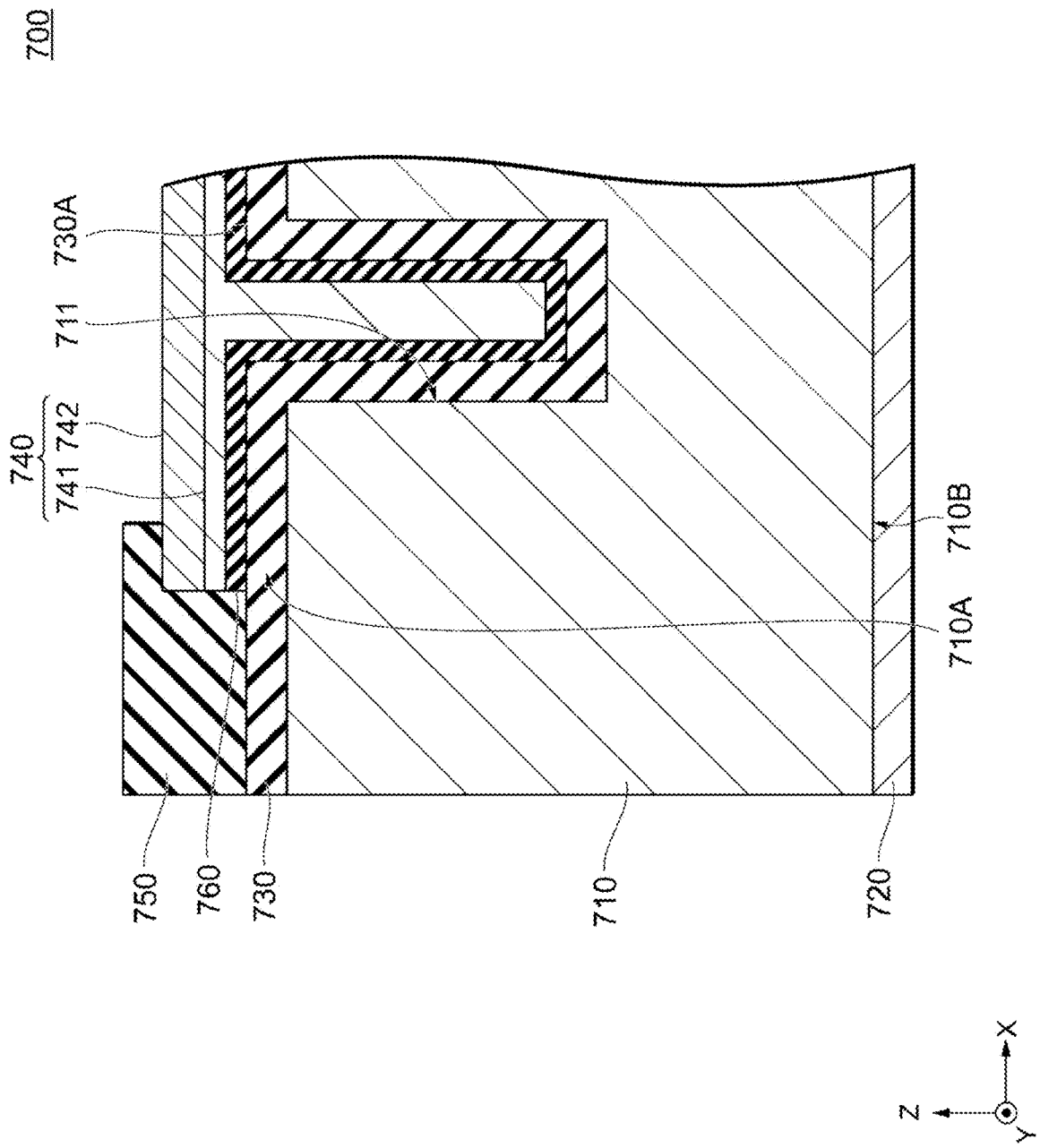
FIG. 15 is a cross-sectional view schematically illustrating a modified example of the configuration of the capacitor according to the seventh exemplary embodiment.

A configuration of a capacitor 700 according to a seventh exemplary embodiment will be described with reference to FIGS. 14 and 15. FIG. 14 is a cross-sectional view schematically illustrating the configuration of the capacitor according to the seventh embodiment. FIG. 15 is a cross-sectional view schematically illustrating a modified example of the configuration of the capacitor according to the seventh embodiment.

As shown, the capacitor 700 according to the seventh embodiment includes a base member 710, a first conductor film 720, a dielectric film 730, a second conductor film 740 having a first conductor layer 741 and a second conductor layer 742, a protective film 750, and a stress relieving layer 760, similarly to the capacitor 600 according to the sixth embodiment. The base member 710 has a first main surface 710A located on the side of the dielectric film 730 and a second main surface 710B located on the side of the first conductor film 720, and a trench portion 711 is formed on the side of the first main surface 710A of the base member 710. The dielectric film 730 has an upper surface 730A located on the side of the second conductor film 740.

The capacitor 700 according to the seventh embodiment is different from the capacitor 600 according to the sixth embodiment in that the stress relieving layer 760 is provided in a region inside the first conductor layer 741. The stress relieving layer 760 is provided between the first conductor layer 741 and the dielectric film 730. When the first main surface 710A of the base member 710 is viewed in a planar view, the outer end surface of the stress relieving layer 760 coincides with the end surface of the first conductor layer 741, and the upper surface of the stress relieving layer 760 is covered with the first conductor layer 741.

In the configuration example illustrated in FIG. 14, the stress relieving layer 760 is provided outside the trench portion 711. The stress relieving layer 760 is formed, for example, by oxidizing a part of the first conductor layer 741. In the case where a part of the first conductor layer 741 is oxidized, oxygen in the atmosphere may be supplied to the exposed end surface of the first conductor layer 741, and the oxygen in the dielectric film 730 may be supplied to the lower surface of the first conductor layer 741.

In the modified example illustrated in FIG. 15, the stress relieving layer 760 is provided in a region including the inside of the trench portion 711. Inside the trench portion 711, the stress relieving layer 760 is formed in a cylindrical shape along the upper surface 730A of the dielectric film 730. Further, the stress relieving layer 760 may be provided so as to overlap with the entire first conductor layer 741 or the entire second conductor layer 742 when the first main surface 710A of the base member 710 is viewed in a planar view.

Eighth Exemplary Embodiment

A configuration of a capacitor 800 according to an eighth exemplary embodiment will be described with reference to

15

Figure 16:
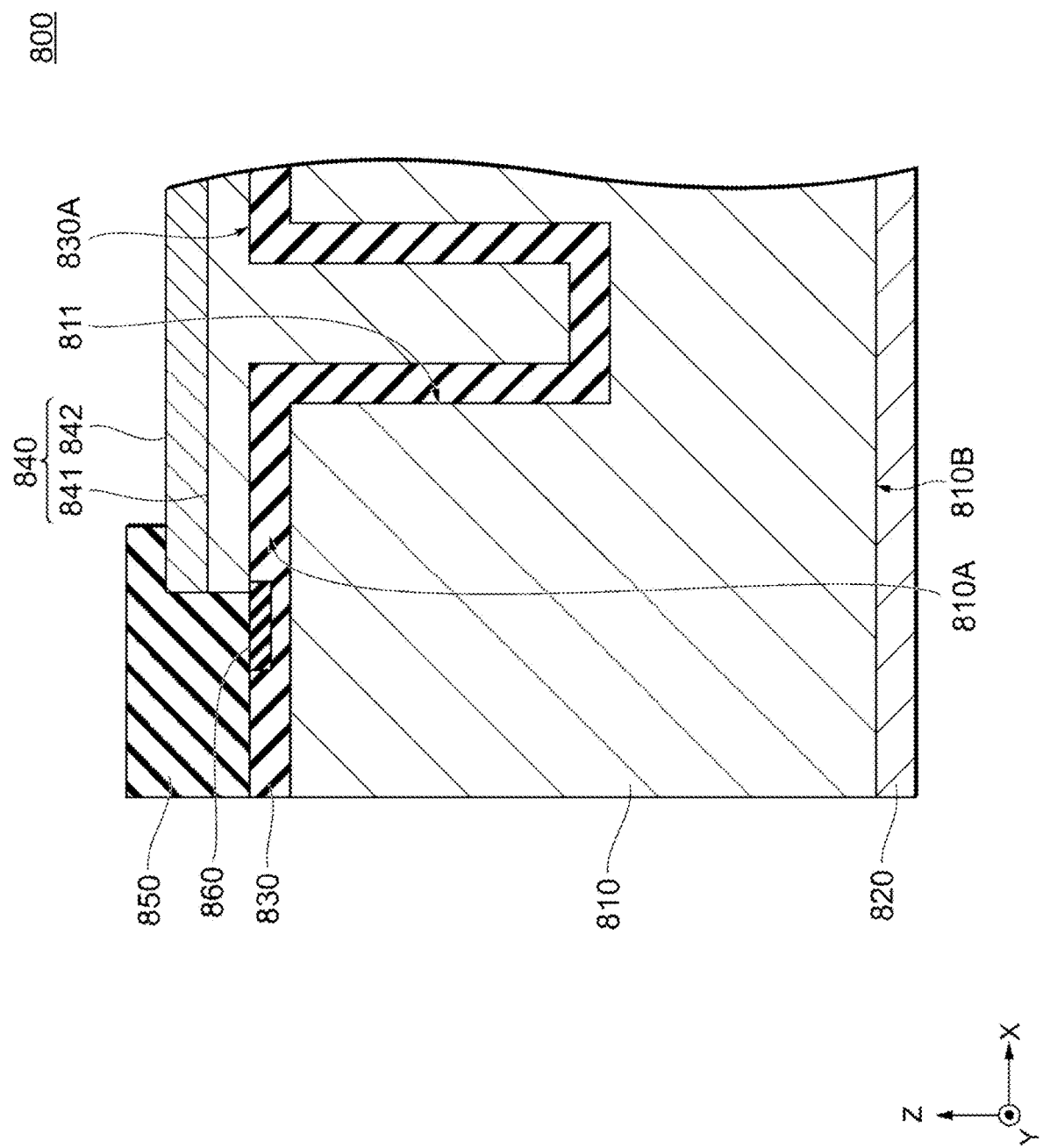
FIG. 16 is a cross-sectional view schematically illustrating a configuration of a capacitor according to an eighth exemplary embodiment.

FIG. 16. FIG. 16 is a cross-sectional view schematically illustrating the configuration of the capacitor according to the eighth embodiment.

The capacitor 800 according to the eighth embodiment includes a base member 810, a first conductor film 820, a dielectric film 830, a second conductor film 840 having a first conductor layer 841 and a second conductor layer 842, a protective film 850, and a stress relieving region 860, similarly to the capacitor 600 according to the sixth embodiment. The stress relieving region 860 is one aspect of the stress relieving portion, and corresponds to the stress relieving portion 660 in the sixth embodiment. The base member 810 has a first main surface 810A located on the side of the dielectric film 830 and a second main surface 810B located on the side of the first conductor film 820, and a trench portion 811 is formed on the side of the first main surface 810A of the base member 810. The dielectric film 830 has an upper surface 830A located on the side of the second conductor film 840.

The capacitor 800 according to the eighth embodiment is different from the capacitor 600 according to the sixth embodiment in that the stress relieving region 860 is formed inside the dielectric film 830. The stress relieving region 860 is formed in a portion including the upper surface of the dielectric film 830. When the first main surface 810A of the base member 810 is viewed in a planar view, the stress relieving region 860 is formed from the region inside the second conductor film 840 to the region outside the second conductor film 840, and overlaps with the end surface of the second conductor film 840. The stress relieving region 860 is formed, for example, by implanting an impurity into the dielectric film 830. The impurity implantation is performed, for example, by an ion doping treatment on the upper surface 830A of the dielectric film 830 after providing the first conductor layer 841 or the second conductor layer 842.

When the first main surface 810A of the base member 810 is viewed in a planar view, if the stress relieving region 860 overlaps with the end surface of the second conductor film 840, the stress relieving region may be provided in the outer region without being provided in the region inside the second conductor film 840. In other words, when the first main surface 810A of the base member 810 is viewed in a planar view, the end surface on the side of the trench portion 811 of the stress relieving region 860 may coincide with the end surface of the second conductor film 840. Similarly to the modified example of the seventh embodiment illustrated in FIG. 15, the stress relieving region 860 may be formed in a region including the inside of the trench portion 811.

As described above, according to one exemplary aspect of the present invention a capacitor 100 is provided that includes a base 110 having the first main surface 110A and the second main surface 110B opposed to each other and the trench portion 111 formed on a side of the first main surface 110A. Moreover, the dielectric film 130 is provided in a region including an inside of the trench portion 111 on the side of the first main surface 110A of the base 110; the conductor film 140 is provided that includes the first conductor layer 141 provided on the dielectric film 130, which is the region including the inside of the trench portion 111, and the second conductor layer 142 provided on the first conductor layer 141; and the stress relieving layer 160 is provided in contact with at least a part of the end portion of the first conductor layer 141. In the exemplary aspect, the thickness T6 of the stress relieving layer 160 is smaller than the thickness T4 of the conductor film 140, outside the trench portion 111 of the first main surface 110A of the base member 110.

16

Further, according to another exemplary aspect of the present invention, a capacitor 100 is provided that includes the base 110 having the first main surface 110A and the second main surface 110B opposed to each other and the trench portion 111 formed on a side of the first main surface 110A. In addition, the dielectric film 130 is provided in a region including an inside of the trench portion 111 on the side of the first main surface 110A of the base 110; the conductor film 140 is provide that includes the first conductor layer 141 provided on the dielectric film 130, which is the region including the inside of the trench portion 111, and the second conductor layer 142 is provided on the first conductor layer 141. Furthermore, the stress relieving layer 160 is provided in contact with at least a part of the end portion of the first conductor layer 141 and a direction of a residual stress of the stress relieving layer 160 is opposite to a direction of a residual stress of the second conductor layer 142.

According to the above exemplary aspect, the transfer of the internal stress concentrated on the end portion of the second conductor layer to the dielectric film can be relieved, and the reduction in insulation properties due to the damage of the dielectric film or the malfunction due to the short circuit of the upper electrode and the lower electrode can be suppressed. In other words, even when a trench capacitor in which damage to the dielectric film is likely to occur as compared with a capacitor in which the upper electrode and the lower electrode are flat, the reliability of the capacitor can be improved.

In an exemplary aspect, the stress relieving layer 660 can be disposed on the upper surface 630A opposed to the first conductor layer 641, in the dielectric film 630. According to this, the stress relieving layer is disposed in the transfer path of the internal stress from the second conductor film to the dielectric film, whereby it is possible to more effectively suppress the damage to the dielectric film.

Moreover, the stress relieving layer 760 can be disposed in the region inside the first conductor layer 741 when the first main surface 710A of the base member 710 is viewed in a planar view.

The stress relieving layer 760 can also be disposed in a region including the inside of the trench portion 711. According to this configuration, the stress of the second conductor film can be relieved over a wide range, damage to the dielectric film can be further suppressed. Further, since the stress relieving layer is provided so as to be opposed to the corners of the trench portion on which stress is likely to be concentrated, damage to the dielectric film at the corners of the trench portion can be suppressed.

Yet further, the stress relieving layer 660 can be disposed in the region outside the first conductor layer 641 when the first main surface 610A of the base member 610 is viewed in a planar view.

The stress relieving region 860 can also be formed inside the dielectric film 830.

When the first main surface 610A of the base member 610 is viewed in a planar view, the end surface of the first conductor layer 641 can coincide with the end surface of the second conductor layer 642.

The end surface of the first conductor layer 141 can also be located outside the second conductor layer 142 when the first main surface 110A of the base member 110 is viewed in a planar view.

In addition, the stress relieving layer 160 can be disposed in contact with at least one of the upper surface and the end surface of the first conductor layer 141.

The stress relieving layer 260 can also cover the entire upper surface of the end portion of the first conductor layer 241.

In addition, the stress relieving layer 360 can cover the entire end surface of the end portion of the first conductor layer 341.

In an exemplary aspect, the stress relieving layer 360 is not necessarily in contact with the second conductor layer 342. Even if the stress relieving layer is separated from the end portion of the second conductor layer on which internal stress is concentrated, the stress relieving layer is in contact with the end portion of the first conductor layer which is the transfer path of the internal stress, whereby it is possible to relieve the transfer of the internal stress to the dielectric film.

Moreover, the stress relieving layer 560 can be provided between the first conductor layer 541 and the second conductor layer 542. According to this configuration, it is more effectively relieve the transfer of internal stress concentrated on the end portion of the second conductor layer to the dielectric film.

In addition, the second conductor layer 142 can have a tensile stress, and the stress relieving layer 160 may have a compressive stress. According to this configuration, at least a part of the tensile stress of the second conductor layer can be offset by the compressive stress of the stress relieving layer.

The first conductor layer 141 can comprises a silicon-based semiconductor containing at least one of phosphorus, boron or arsenic as an impurity. According to this configuration, when the base member is a low-resistance silicon substrate, the thermal stress on the base member that is generated in the first conductor layer can be reduced.

In another aspect, the stress relieving layer 160 can comprise a Si oxide containing at least one of phosphorus, boron or arsenic as an impurity. According to this configuration, it is possible to use, as the stress relieving layer, an oxide film formed on the surface by thermally oxidizing the first conductor layer made of the silicon-based semiconductor containing at least one of phosphorus, boron or arsenic as the impurity. Therefore, the production can be simplified as compared with the stress relieving layer provided by vacuum deposition or the like. Further, the adhesion of the stress relieving layer to the first conductor layer can be improved.

The stress relieving layer 160 can also be made of silicon nitride containing hydrogen as an impurity. According to this configuration, it is possible to obtain the effect similar to the above-described effect.

The capacitor according to an exemplary aspect can also include the protective film 150 provided so as to avoid at least a part of the second conductor layer 142. According to this configuration, it is possible to suppress the generation of the leak current due to the creeping discharge and to increase the withstand voltage of the capacitor.

As described above, according to one exemplary aspect of the present invention, a method is provided for producing a capacitor including the steps of: preparing the base member 110 having the first main surface 110A and the second main surface 110B opposed to each other; forming the trench portion 111 on the side of the first main surface 110A of the base member 110; providing the dielectric film 130 in a region including an inside of the trench portion 111 on the side of the first main surface 110A of the base member 110; providing the first conductor layer 141 on the dielectric film 130 in a region including the inside of the trench portion 111; providing the stress relieving layer 160 so as to be in contact with at least a part of the end portion of the first conductor layer 141; and providing the second conductor layer 142 on the first conductor layer 141, where the thickness T6 of the stress relieving layer 160 is smaller than the thickness T4 of the conductor film 140 made of the first conductor layer 141 and the second conductor layer 142, outside the trench portion 111 of the first main surface 110A of the base member 110.

According to the above exemplary aspects, the transfer of the internal stress concentrated on the end portion of the second conductor layer to the dielectric film can be relieved. Moreover, the reduction in insulation properties due to the damage of the dielectric film or the malfunction due to the short circuit of the upper electrode and the lower electrode can be suppressed. In other words, even for a trench capacitor in which damage to the dielectric film is likely to occur as compared with a capacitor in which the upper electrode and the lower electrode are flat, the reliability of the capacitor can be improved.

In an exemplary aspect, the first conductor layer 141 comprises a silicon-based semiconductor containing at least one of phosphorus, boron or arsenic as an impurity, and the step of providing the stress relieving layer 160 may include a step of providing a Si oxide by thermally oxidizing the silicon-based semiconductor. According to this configuration, it is possible to use, as the stress relieving layer, an oxide film formed on the surface by thermally oxidizing the first conductor layer made of the silicon-based semiconductor containing at least one of phosphorus, boron or arsenic as the impurity. Therefore, the production can be simplified as compared with the step of providing the stress relieving layer by vacuum deposition or the like. Further, the adhesion of the stress relieving layer to the first conductor layer can be improved.

In another exemplary aspect, the first conductor layer 141 comprises a silicon-based semiconductor containing at least one of phosphorus, boron or arsenic as an impurity, and the step of providing the stress relieving layer 160 includes a step of depositing silicon nitride on the silicon-based semiconductor. According to this configuration, it is possible to obtain the effect similar to the above-described effect.

In another aspect, the method can further include a step of providing the protective film 150 on the stress relieving layer 160 and the second conductor layer 142. According to this configuration, generation of the leak current due to the creeping discharge can be decreased and the withstand voltage of the capacitor can be increased.

As described above, according to exemplary aspects of the present invention, a capacitor is provided with improved reliability compared with conventional designs.

Finally, it is noted that each of the exemplary embodiments described above is for facilitating understanding of the present invention and is not intended to limit the present invention. The present invention can be modified and improved without departing from the spirit of the invention, and equivalents thereof are also included in the present invention. That is, ones obtained by appropriately modifying designs of the respective embodiments by those skilled in the art are also included within the scope of the present invention as long as they include the features of the present invention. For example, each of the elements included in the embodiments as well as its arrangement, material, condition, shape, size, and the like are not limited to those exemplified and may be appropriately changed. Further, each of the elements included in each embodiment can be combined as long as it is technically possible, and a combination thereof contains the scope of the present invention as long as it includes the features of the present invention.

DESCRIPTION OF REFERENCE SYMBOLS

100: Capacitor
101: First region
102: Second region
110: Base member
110A: First main surface
110B: Second main surface
111: Trench portion
120: First conductor film
130: Dielectric film
131: First dielectric layer
132: Second dielectric layer
140: Second conductor film
141: First conductor layer
142: Second conductor layer
150: Protective film
160: Stress relieving layer

The invention claimed is:

1. A capacitor comprising:
a base having first and second main surfaces that oppose each other and a trench disposed on a side of the first main surface;
a dielectric film disposed in a region that includes an inside of the trench;
a conductor film having a first conductor layer disposed on the dielectric film, which extends inside the trench, and a second conductor layer disposed on the first conductor layer; and
a stress relieving structure disposed in contact with an end portion of the first conductor layer,
wherein the stress relieving structure comprises a thickness that is smaller than a thickness of the conductor film outside the trench disposed on the side of the first main surface of the base,
wherein the stress relieving structure is disposed on an upper surface opposing the first conductor layer of the dielectric film, and
wherein the stress relieving structure is disposed in a region inside the first conductor layer in a planar view of the first main surface of the base.

2. The capacitor according to claim 1, wherein the stress relieving structure is disposed inside of the trench disposed on the side of the first main surface of the base.

3. The capacitor according to claim 1, wherein the stress relieving structure is disposed in a region outside the first conductor layer in a planar view of the first main surface of the base.

4. The capacitor according to claim 1, wherein the stress relieving structure is disposed inside the dielectric film.

5. The capacitor according to claim 1, wherein an end surface of the first conductor layer coincides with an end surface of the second conductor layer in a planar view of the first main surface of the base.

6. The capacitor according to claim 1, wherein an end surface of the first conductor layer is disposed outside an end surface of the second conductor layer in a planar view of the first main surface of the base.

7. The capacitor according to claim 6, wherein the stress relieving structure is disposed in contact with an upper surface and the end surface of the first conductor layer.

8. The capacitor according to claim 1, wherein the stress relieving structure does not directly contact the second conductor layer of the conductor film.

9. The capacitor according to claim 1, wherein the stress relieving structure is disposed between the first and second conductor layers of the conductor film.

10. The capacitor according to claim 1, further comprising a protective film disposed so as to avoid at least a part of the second conductor layer.

11. The capacitor according to claim 1, wherein the thickness of each of the stress relieving structure and the conductor film extends in a thickness direction of the capacitor, and the stress relieving structure is disposed outside the conductor film in a widthwise direction of the capacitor that is orthogonal to the thickness direction.

12. The capacitor according to claim 1, wherein a direction of a residual stress of the stress relieving structure is opposite to a direction of a residual stress of the second conductor layer.

13. The capacitor according to claim 1,
wherein the stress relieving structure is configured to provide a residual stress that extends in a direction that is opposite a residual stress of the second conductor layer.

14. The capacitor according to claim 1, wherein the dielectric film is disposed above the first main surface of the base.

15. The capacitor according to claim 1, wherein the end portion of the first conductor layer is an end surface with the stress relieving structure disposed in contact with the end surface.

16. A capacitor comprising:
a base having first and second main surfaces that oppose each other and a trench disposed on a side of the first main surface;
a dielectric film disposed in a region that includes an inside of the trench;
a conductor film having a first conductor layer disposed on the dielectric film, which extends inside the trench, and a second conductor layer disposed on the first conductor layer; and
a stress relieving structure disposed in contact with an end portion of the first conductor layer,
wherein the stress relieving structure comprises a thickness that is smaller than a thickness of the conductor film outside the trench disposed on the side of the first main surface of the base,
wherein the first conductor layer comprises a silicon-based semiconductor that contains at least one of phosphorus, boron or arsenic as an impurity, and
wherein the stress relieving structure comprises silicon oxide containing the at least one of phosphorus, boron or arsenic as an impurity.

17. A capacitor comprising:
a base having first and second main surfaces that oppose each other and a trench disposed on a side of the first main surface;
a dielectric film disposed in a region that includes an inside of the trench;
a conductor film having a first conductor layer disposed on the dielectric film, which extends inside the trench, and a second conductor layer disposed on the first conductor layer; and
a stress relieving structure disposed in contact with an end portion of the first conductor layer,
wherein the stress relieving structure comprises a thickness that is smaller than a thickness of the conductor film outside the trench disposed on the side of the first main surface of the base, and
wherein the stress relieving structure comprises silicon nitride containing hydrogen as an impurity.

* * * * *